(12) United States Patent
Chanemougame et al.

(10) Patent No.: US 10,074,564 B2
(45) Date of Patent: Sep. 11, 2018

(54) SELF-ALIGNED MIDDLE OF THE LINE (MOL) CONTACTS

(71) Applicant: GLOBALFOUNDRIES INC., Grand Cayman (KY)

(72) Inventors: Daniel Chanemougame, Niskayuna, NY (US); Ruilong Xie, Schenectady, NY (US); Lars Liebmann, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/878,486

(22) Filed: Jan. 24, 2018

(65) Prior Publication Data

US 2018/0166335 A1    Jun. 14, 2018

Related U.S. Application Data

(62) Division of application No. 15/354,212, filed on Nov. 17, 2016, now Pat. No. 9,941,162.

(51) Int. Cl.
*H01L 29/417*    (2006.01)
*H01L 21/768*    (2006.01)
(Continued)

(52) U.S. Cl.
CPC .. *H01L 21/76897* (2013.01); *H01L 21/28247* (2013.01); *H01L 21/76816* (2013.01);
(Continued)

(58) Field of Classification Search
CPC ......... H01L 29/41775; H01L 29/41783; H01L 29/41733; H01L 21/76897
See application file for complete search history.

(56) References Cited

U.S. PATENT DOCUMENTS 6,787,469 B2    9/2004   Houston et al.
2009/0065814 A1  3/2009   Bhalla et al.
(Continued)

OTHER PUBLICATIONS

U.S. Appl. No. 15/388,400, Office Action Communication dated Aug. 11, 2017, pp. 1-20.
(Continued)

*Primary Examiner* — Daniel Luke
(74) *Attorney, Agent, or Firm* — Gibb & Riley, LLC; Francois Pagette

(57) ABSTRACT

Disclosed are methods and integrated circuit (IC) structures. The methods enable formation of a gate contact on a gate above (or close thereto) an active region of a field effect transistor (FET) and provide protection against shorts between the gate contact and metal plugs on source/drain regions and between the gate and source/drain contacts to the metal plugs. A gate with a dielectric cap and dielectric sidewall spacer is formed on a FET channel region. Metal plugs with additional dielectric caps are formed on the FET source/drain regions such that the dielectric sidewall spacer is between the gate and the metal plugs and between the dielectric cap and the additional dielectric caps. The dielectric cap, dielectric sidewall spacer and additional dielectric caps are different materials preselected to be selectively etchable, allowing for misalignment of a contact opening to the gate without risking exposure of any metal plugs and vice versa.

18 Claims, 30 Drawing Sheets

(51) Int. Cl.
*H01L 21/8238* (2006.01)
*H01L 21/28* (2006.01)
*H01L 27/092* (2006.01)
*H01L 29/66* (2006.01)
*H01L 23/522* (2006.01)
*H01L 29/40* (2006.01)
*H01L 29/78* (2006.01)
*H01L 23/528* (2006.01)

(52) U.S. Cl.
CPC ............... *H01L 21/76834* (2013.01); *H01L 21/823814* (2013.01); *H01L 21/823821* (2013.01); *H01L 21/823842* (2013.01); *H01L 21/823864* (2013.01); *H01L 21/823871* (2013.01); *H01L 23/5226* (2013.01); *H01L 23/5283* (2013.01); *H01L 27/0924* (2013.01); *H01L 29/401* (2013.01); *H01L 29/41783* (2013.01); *H01L 29/41791* (2013.01); *H01L 29/6656* (2013.01); *H01L 29/66545* (2013.01); *H01L 29/66613* (2013.01); *H01L 29/785* (2013.01); *H01L 2029/7858* (2013.01)

(56) References Cited

U.S. PATENT DOCUMENTS

| | | |
|---|---|---|
| 2009/0065855 A1 | 3/2009 | Bhalla et al. |
| 2009/0065861 A1 | 3/2009 | Bhalla et al. |
| 2014/0077305 A1 | 3/2014 | Pethe et al. |
| 2014/0264444 A1 | 9/2014 | Guo et al. |
| 2014/0284671 A1 | 9/2014 | Hung et al. |
| 2015/0214113 A1 | 7/2015 | Bouche et al. |
| 2016/0293485 A1 | 10/2016 | Song et al. |
| 2017/0186849 A1* | 6/2017 | Chen ............... H01L 29/6656 |

OTHER PUBLICATIONS

U.S. Appl. No. 15/388,400, Notice of Allowance dated Dec. 12, 2017, pp. 1-15.
U.S. Appl. No. 15/354,212, Restriction Requirement dated Oct. 4, 2017, pp. 1-7.
U.S. Appl. No. 15/354,212, Notice of Allowance dated Jan. 5, 2018, pp. 1-22.

* cited by examiner

SELF-ALIGNED MIDDLE OF THE LINE (MOL) CONTACTS

CROSS-REFERENCE TO RELATED APPLICATIONS

The present invention claims the benefit under 35 U.S.C. § 120 as a divisional of U.S. patent application Ser. No. 15/354,212 filed on Nov. 17, 2016, now issued as U.S. Pat. No. 9,941,162 on Apr. 10, 2018, the entire teachings of which are incorporated herein by reference.

FIELD OF THE INVENTION

The present invention relates to the middle of the line (MOL) contacts that connect semiconductor devices to back end of the line (BEOL) metal levels and, more particularly, to methods of forming integrated circuit (IC) structures with self-aligned MOL contacts to avoid shorts, while enabling further area scaling, and to the resulting IC structures.

BACKGROUND

Integrated circuit (IC) structures have middle of the line (MOL) contacts that connect the semiconductor devices to back end of the line (BEOL) metal levels. For example, a field effect transistor (FET) can have a gate contact (also referred to herein as a CB contact) and source/drain contacts (also referred to herein as CA contacts). The gate contact can extend vertically through interlayer dielectric (ILD) material from a metal wire or via in the first back end of the line (BEOL) metal level (referred to herein as M0) to the gate of the FET. The source/drain contacts can extend vertically through ILD material from metal wires or vias in the BEOL metal level to metal plugs (also referred to herein as TS contacts), which are on the source/drain regions of the FET. Historically, in order to avoid shorts between the gate contact and the metal plugs, the gate contact is formed on a portion of the gate that is offset from the active region of the FET and, more particularly, on a portion of the gate that extends laterally over the adjacent isolation region. However, given the ever present need for size scaling of devices, it would be advantageous to provide a method that, not only allows for a gate contact to be formed on a portion of the gate directly above the active region (referred to herein as a CB-over-active or CBoA) or close thereto, but ensures that the risk of a short developing between the gate contact and any of the metal plugs is avoided (or at least significantly reduced).

SUMMARY

In view of the foregoing, disclosed herein are methods of forming an integrated circuit (IC) structure, which includes one or more field effect transistors (FETs). The disclosed methods allow for a gate contact to be formed on a portion of a gate aligned above an active region of a FET (i.e., a CBoA) or to be formed close thereto (e.g., to be formed on a portion of a gate in close proximity to the active region and/or in close proximity to any metal plugs). The disclosed methods also provide protection against the development of shorts between the gate contact and any metal plugs on the source/drain regions of the FET and further between the gate and source/drain contacts to the metal plugs. Specifically, in the methods, a gate with a dielectric cap and dielectric sidewall spacer can be formed on the channel region of a FET or, optionally, on the channel regions of multiple FETs. Additionally, metal plugs with additional dielectric caps can be formed on the source/drain regions of the FET or FETs such that the dielectric sidewall spacer is positioned laterally between the gate and the metal plugs and further between the dielectric cap on the gate and the additional dielectric caps on the metal plugs. The dielectric cap on the gate, dielectric sidewall spacer and additional dielectric caps on the metal plugs can be made of different dielectric materials preselected to be selectively etchable, thereby allowing for possible misalignment of the contact opening to the gate without risking exposure of any metal plugs and vice versa. Also disclosed are resulting IC structures.

Generally, disclosed herein are methods of forming an integrated circuit (IC) structure, which includes at least one field effect transistor (FET). In the methods, a semiconductor body can be formed and can have areas designated for source/drain regions and a channel region positioned laterally between the source/drain regions. A gate having a dielectric cap and a dielectric sidewall spacer can be formed on the channel region. At least one dielectric layer can be formed so that a portion thereof is above the source/drain regions and positioned laterally adjacent to the dielectric sidewall spacer. Metal plug openings can be formed within the at least one dielectric layer so as to be aligned above the source/drain regions and metal plugs having additional dielectric caps can subsequently be formed within the metal plug openings. Thus, the dielectric sidewall spacer will be positioned laterally between the metal plugs and the gate and further between the additional dielectric caps and the dielectric cap. The dielectric cap on the gate, the dielectric sidewall spacer, and the additional dielectric caps on the metal plugs can be made of different dielectric materials.

An interlayer dielectric material can be deposited above and immediately adjacent to the at least one dielectric layer, the dielectric cap on the gate, the dielectric sidewall spacer, and the additional dielectric caps on the metal plugs. A first contact opening can be formed through the interlayer dielectric material and the dielectric cap to the gate. Additionally, second contact openings can be formed through the interlayer dielectric material and the additional dielectric caps to the metal plugs. The first contact opening and the second contact openings can be filled with conductive material to form a first contact to the gate and second contacts to the metal plugs, respectively.

Such methods can be used during the formation of a variety of IC structures such as IC structures that incorporate planar FET(s) or non-planar FET(s), IC structures that incorporate a conventional gate-first gate or a replacement metal gate, IC structures that incorporate a FET with multiple semiconductor bodies, IC structures that incorporate a complementary metal oxide semiconductor (CMOS) device with both an N-type FET (NFET) and a P-type FET (PFET), IC structures that incorporate a CMOS devices where the NFET and PFET have a shared gate, etc.

Thus, for example, one method embodiment disclosed herein can be used to form an IC structure that incorporates multiple non-planar FETs and, particularly, that incorporates a CMOS device, where the NFET and PFET are non-planar FETs each with one or more semiconductor bodies and where the NFET and PFET share a replacement metal gate.

Specifically, this method embodiment can include forming at least one first semiconductor body for a first-type field effect transistor (e.g., an NFET) and at least one second semiconductor body for a second-type field effect transistor (e.g., a PFET). Each first semiconductor body has areas designated for first source/drain regions and a first channel region positioned laterally between the first source/drain regions and each second semiconductor body can have areas designated for second source/drain regions and a second channel region positioned laterally between the second source/drain regions.

A sacrificial gate having a dielectric sidewall spacer can be formed across the first channel region(s) in the first semiconductor body(ies) and further across the second channel region(s) in the second semiconductor body(ies). Additionally, epitaxial semiconductor material can be deposited on the first source/drain regions to form raised first source/drain regions and on the second source/drain regions to form raised second source/drain regions.

A conformal dielectric layer can be formed over the sacrificial gate, the raised first source/drain regions and the raised second source/drain regions. Then, an additional dielectric layer can be formed on the conformal dielectric layer.

The sacrificial gate can subsequently be removed and replaced with a replacement metal gate having a dielectric cap. Metal plug openings can then be formed through the additional dielectric layer and the conformal dielectric layer to the raised first source/drain regions and the raised second source/drain regions and metal plugs having additional dielectric caps can be formed in the metal plug openings. The metal plugs can be formed such that the dielectric sidewall spacer and conformal dielectric layer are positioned laterally between the metal plugs and the gate and further between the additional dielectric caps and the dielectric cap. The dielectric cap, the dielectric sidewall spacer, and the additional dielectric caps can be made of different dielectric materials. Furthermore, the dielectric sidewall spacer and the conformal dielectric layer can be made of the same dielectric material.

An interlayer dielectric material can be deposited over the dielectric cap, the dielectric sidewall spacer, the conformal dielectric layer and the additional dielectric caps. A first contact opening can be formed through the interlayer dielectric material and the dielectric cap to the replacement metal gate. Additionally, second contact openings can be formed through the interlayer dielectric material and the additional dielectric caps to the metal plugs. The first contact opening and the second contact openings can be filled with conductive material to form a first contact to the replacement metal gate and second contacts to the metal plugs, respectively.

In each of methods described above the different dielectric materials used for the dielectric cap on the replacement metal gate, the dielectric sidewall spacer on the replacement metal gate and the additional dielectric caps on the metal plugs can be preselected so that the dielectric cap is selectively etchable over the dielectric sidewall spacer and the additional dielectric caps during the forming of the first contact opening. Thus, the first contact will be self-aligned to the gate (i.e., will be a self-aligned first contact), regardless of whether any misalignment occurs, and the risk of a short occurring between the first contact and any of the metal plugs is avoided (or at least significantly reduced). The different dielectric materials can further be preselected so that the additional dielectric caps are selectively etchable over the dielectric sidewall spacer and the dielectric cap during the forming of the second contact openings. Thus, the second contacts will be self-aligned to the metal plugs (i.e., will be self-aligned second contacts), regardless of whether any misalignment occurs, and the risk of a short occurring between any of the second contacts and the gate is avoided (or at least significantly reduced).

Also disclosed herein are integrated circuit (IC) structures, which include at least one field effect transistor (FET). The FET can include a semiconductor body with source/drain regions and a channel region positioned laterally between the source/drain regions. A gate having a dielectric cap and a dielectric sidewall spacer can be on the channel region. At least one dielectric layer can be above the source/drain regions and positioned laterally adjacent to the dielectric sidewall spacer. Additionally, metal plugs having additional dielectric caps, respectively, can be within metal plug openings in the at least one dielectric layer aligned above the source/drain regions such that the dielectric sidewall spacer is positioned laterally between the metal plugs and the gate and further between the additional dielectric caps and the dielectric cap. The dielectric cap, the dielectric sidewall spacer, and the additional dielectric caps can be made of different dielectric materials.

An interlayer dielectric material can be above and immediately adjacent to the at least one dielectric layer, the dielectric cap, the dielectric sidewall spacer, and the additional dielectric caps. A first contact opening can extend vertically through the interlayer dielectric material and the dielectric cap to the gate. Additionally, second contact openings can extend vertically through the interlayer dielectric material and the additional dielectric caps to the metal plugs. The first contact opening and the second contact openings can be filled with conductive material to form a first contact to the gate and second contacts to the metal plugs, respectively.

The above described IC structures can, for example, incorporate planar FET(s) or non-planar FET(s), can incorporate a conventional gate-first gate or a replacement metal gate, can incorporate a FET with multiple semiconductor bodies, can incorporate a complementary metal oxide semiconductor (CMOS) device with both an N-type FET (NFET) and a P-type FET (PFET), can incorporate a CMOS devices where the NFET and PFET have a shared gate, etc.

In any case, in each of these IC structures the different dielectric materials used for the dielectric cap on the gate, the dielectric sidewall spacer on the gate and the additional dielectric caps on the metal plugs are preselected so that the dielectric cap is selectively etchable over the dielectric sidewall spacer and the additional dielectric caps during the forming of the first contact opening. Thus, the first contact is self-aligned to the gate (i.e., is a self-aligned first contact), regardless of any misalignment, and the risk of a short occurring between the first contact and any of the metal plugs is avoided (or at least significantly reduced). The different dielectric materials can further be preselected so that the additional dielectric caps are selectively etchable over the dielectric sidewall spacer and the dielectric cap during the forming of the second contact openings. Thus, the second contacts are self-aligned to the metal plugs (i.e., are self-aligned second contacts), regardless of any misalignment, and the risk of a short occurring between any of the second contacts and the gate is avoided (or at least significantly reduced).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
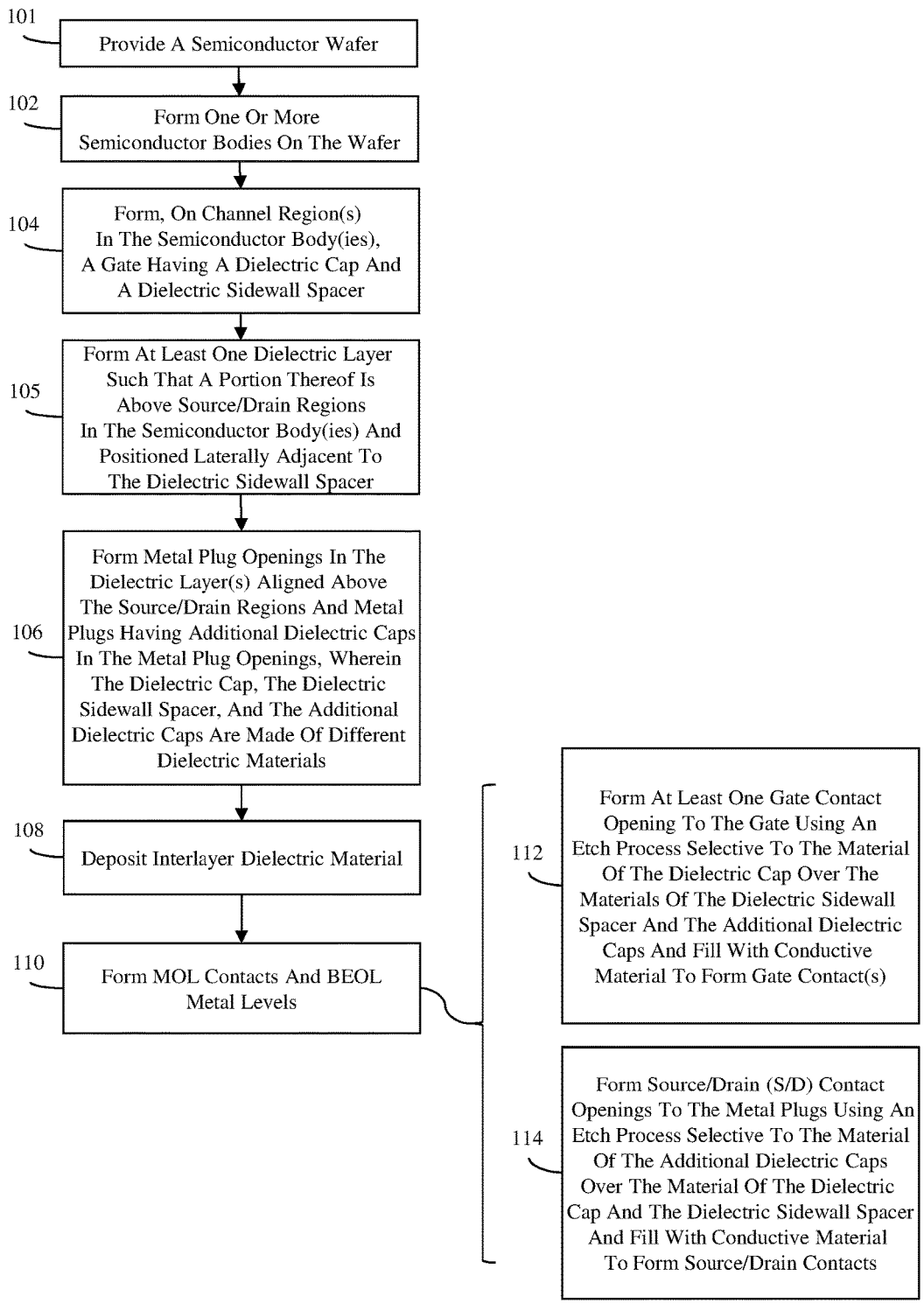
FIG. 1 is a flow diagram illustrating methods of forming an integrated circuit (IC) structure that incorporates at least one field effect transistor (FET), where the FET has a gate and where a gate contact to the gate lands on a portion of the gate above (or close thereto) an active region.

As mentioned above, integrated circuit (IC) structures have middle of the line (MOL) contacts that connect the semiconductor devices to back end of the line (BEOL) metal levels. For example, a field effect transistor (FET) can have a gate contact (also referred to herein as a CB contact) and source/drain contacts (also referred to herein as CA contacts). The gate contact can extend vertically through inter-layer dielectric (ILD) material from a metal wire or via in the first back end of the line (BEOL) metal level (referred to herein as $M_0$) to the gate of the FET. The source/drain contacts of the FET can extend vertically through ILD material from metal wires or vias in the BEOL metal level to metal plugs (also referred to herein as TS contacts), which are on the source/drain regions of the FET. Historically, in order to avoid shorts between the gate contact and the metal plugs, the gate contact is formed on a portion of the gate that is offset from the active region of the FET and, more particularly, on a portion of the gate that extends laterally over the adjacent isolation region. However, given the ever present need for size scaling of devices, it would be advantageous to provide a method that, not only allows for a gate contact to be formed on a portion of the gate directly above the active region (referred to herein as a CB-over-active or CBoA) or close thereto, but ensures that the risk of a short developing between the gate contact and any of the metal plugs is avoided (or at least significantly reduced).

In view of the foregoing, disclosed herein are methods of forming an integrated circuit (IC) structure, which includes one or more field effect transistors (FETs). The disclosed methods allow for a gate contact to be formed on a portion of a gate aligned above an active region of a FET (i.e., a CBoA) or to be formed close thereto (e.g., to be formed on a portion of a gate in close proximity to the active region and/or in close proximity to any metal plugs). The disclosed methods also provide protection against the development of shorts between the gate contact and any metal plugs on the source/drain regions of the FET and further between the gate and source/drain contacts to the metal plugs. Specifically, in the methods, a gate with a dielectric cap and dielectric sidewall spacer can be formed on the channel region of a FET or, optionally, on the channel regions of multiple FETs. Additionally, metal plugs with additional dielectric caps can be formed on the source/drain regions of the FET or FETs such that the dielectric sidewall spacer is positioned laterally between the gate and the metal plugs and further between the dielectric cap on the gate and the additional dielectric caps on the metal plugs. The dielectric cap, dielectric sidewall spacer and additional dielectric caps can be made of different dielectric materials preselected to be selectively etchable, thereby allowing for possible misalignment of the contact opening to the gate without risking exposure of any metal plugs and vice versa. Also disclosed are resulting IC structures.

Generally, disclosed are methods of forming an integrated circuit (IC) structure that incorporates at least one field effect transistor (FET), where the FET has a gate and where a gate contact to the gate lands on a portion of the gate above (or close thereto) an active region (i.e., where a gate contact is a CBoA). Referring to the flow diagram of FIG. 1, in these methods, a semiconductor wafer is provided (101) and one or more semiconductor bodies can be formed on the wafer (102). Each semiconductor body can be a planar semiconductor body for a planar FET or a non-planar semiconductor body (e.g., a semiconductor fin) for a non-planar FET, such as a fin-type FET (finFET) or a trigate FET. In any case, each semiconductor body can have areas designated for a channel region and for source/drain regions of the FET, wherein the channel region is positioned laterally between the source/drain regions.

A gate, which has a dielectric cap and a dielectric sidewall spacer, can be formed across the channel region of the semiconductor body (or, across the channel regions of multiple semiconductor bodies, if applicable) (104). This gate can be a conventional gate-first gate (e.g., a gate with a silicon dioxide gate dielectric layer and a polysilicon gate conductor layer or any other suitable gate-first gate configuration. Alternatively, this gate can be a replacement metal gate (e.g., a gate with a high-K gate dielectric layer and metal gate conductor layer or any other suitable replacement metal gate configuration) formed by removing a previously formed sacrificial gate and replacing that sacrificial gate with a metal gate (as discussed in greater detail below). In any case, those skilled in the art will recognize that the gate will be positioned adjacent to the top surface of the semiconductor body at the channel region in the case of a planar FET and adjacent to opposing sidewalls and, optionally, above the top surface of the semiconductor body in the case of a non-planar FET.

Additionally, at least one dielectric layer (e.g., a conformal dielectric layer and an additional dielectric layer, as discussed in greater detail below) can be deposited such that the dielectric layer(s) are stacked above the semiconductor body(ies) at the source/drain regions and further positioned laterally adjacent to the dielectric sidewall spacer (105). Subsequently, metal plug openings can be formed in the dielectric layer(s) so as to be aligned above the source/drain regions and metal plugs having additional dielectric caps, respectively, can be formed within the metal plug openings such that the dielectric sidewall spacer is positioned laterally between the metal plugs and the gate and further between the additional dielectric caps and the dielectric cap (106).

At processes 104-106, the dielectric cap, the dielectric sidewall spacer, and the additional dielectric caps should all be made of different dielectric materials. These different materials can be preselected so that, during subsequent processing (e.g., see process steps 110-114, discussed in greater detail below), the dielectric cap is selectively etchable over the dielectric sidewall spacer and the additional dielectric caps and so that the additional dielectric caps are selectively etchable over the dielectric sidewall spacer and the dielectric cap. Exemplary dielectric materials can include, for example, silicon nitride for the dielectric cap, silicon carbon oxide for the dielectric sidewall spacer and silicon oxide for the additional dielectric caps. Alternatively, any other suitable dielectric materials could be used. A chemical mechanical polishing (CMP) process can then be performed. As a result of this CMP process, the dielectric cap and dielectric sidewall spacer on the gate and the additional dielectric caps on the metal plugs all have approximately co-planar top surfaces. Those skilled in the art will recognize that, while ideally the top surfaces of the dielectric cap, dielectric sidewall spacer and additional dielectric caps will be perfectly co-planar following CMP, variations in the reactions of the different dielectric materials to the chemical and/or mechanical forces imparted thereon may result in the levels of the top surfaces of these features being slightly varied.

Subsequently, an interlayer dielectric (ILD) material can be deposited such that it covers and, more particularly, such that it is above and immediately adjacent to the top surfaces of the at least one dielectric layer, the dielectric cap, the dielectric sidewall spacer, and the additional dielectric caps (108). After the ILD material is deposited, another CMP process can be performed.

To complete the IC structure, both middle of the line (MOL) contacts and back end of the line (BEOL) metal levels can be formed (110). The MOL contacts can include at least one first contact to the gate (referred to herein as a gate contact). The first contact can be formed so as to be aligned above the active region of the FET being formed or close thereto (e.g., aligned above a portion of the gate in close proximity to the active region or aligned above a portion of the gate in close proximity to any metal plugs). The MOL contacts can also include second contacts (referred to herein as source/drain contacts) to the metal plugs, which, as mentioned above, are above the source/drain regions. It should be noted that formation a first contact opening for the first contact and second contact openings for the second contacts at process 110 should be performed using separate etch processes. Specifically, the first contact opening for the first contact can be formed through the ILD material and the dielectric cap to the gate using an etch process that is selective to the material of the dielectric cap over the materials of the dielectric sidewall spacer and the additional dielectric caps (112). Additionally, the second contact openings for the second contacts can be formed through the ILD material and the additional dielectric caps to the metal plugs using a different etch process that is selective to the material of the additional dielectric caps over the materials of the dielectric cap and the dielectric sidewall spacer (114). The first contact opening and the second contact openings can be filled with conductive material using the same or different deposition processes, thereby forming the first contact to the gate and the second contacts to the metal plugs.

Since the dielectric cap on the gate is selectively etchable over the dielectric sidewall spacer and the additional dielectric caps during formation of the first contact opening, the first contact will be self-aligned to the gate (i.e., will be a self-aligned first contact), regardless of whether any misalignment occurs, and the risk of a short occurring between the first contact and any of the metal plugs is avoided (or at least significantly reduced). Similarly, since the additional dielectric caps are selectively etchable over the dielectric sidewall spacer and the dielectric cap during formation of the second contact openings, the second contacts will be self-aligned to the metal plugs (i.e., will be self-aligned second contacts), regardless of whether any misalignment occurs, and the risk of a short occurring between any of the second contacts and the gate is avoided (or at least significantly reduced).

The above-described methods can be used during the formation of a variety of different IC structures including, but not limited to, IC structures that incorporate planar FET(s) or non-planar FET(s), IC structures that incorporate a conventional gate-first gate or a replacement metal gate, IC structures that incorporate a complementary metal oxide semiconductor (CMOS) device with both and N-type FET (NFET) and P-type FET (PFET), IC structures that incorporate a CMOS device where the NFET and PFET share a gate, etc.

For purposes of illustration, the method steps are described in even greater detail below and illustrated in the drawings with reference to the formation of an IC structure that incorporates multiple non-planar FETs (e.g., finFETs) and, particularly, that incorporates a CMOS device with both a non-planar NFET with multiple semiconductor bodies and a non-planar PFET with multiple semiconductor bodies, where the NFET and PFET share a replacement metal gate.

Figure 2A:
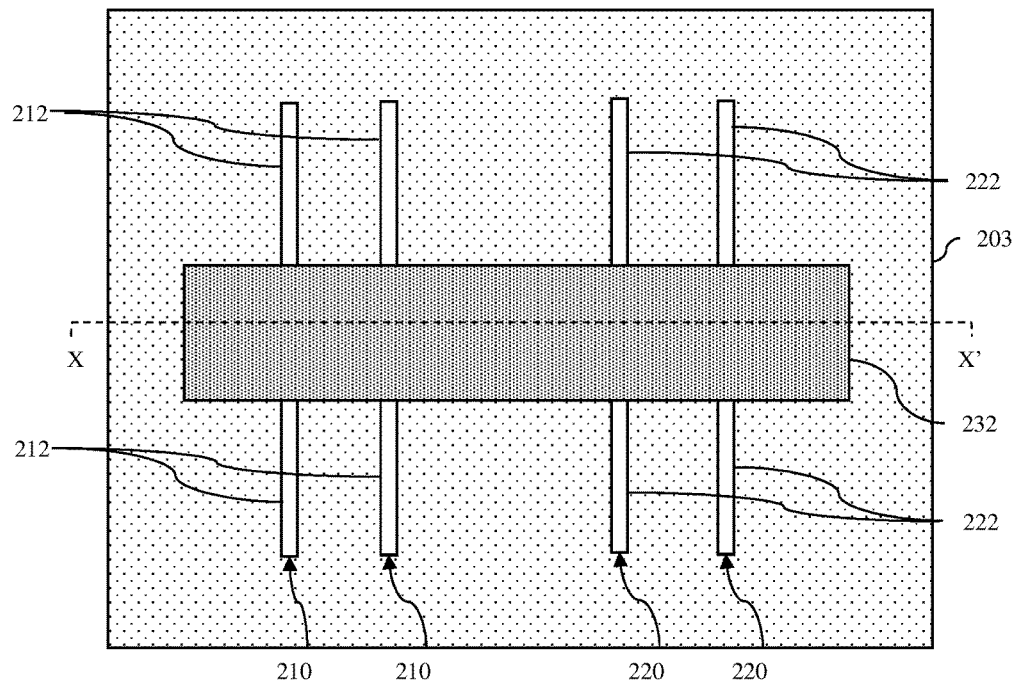
FIGS. 2A-2B are top view and cross section X-X' diagrams illustrating a partially completed structure formed according to the methods of FIG. 1.
Figure 2B:
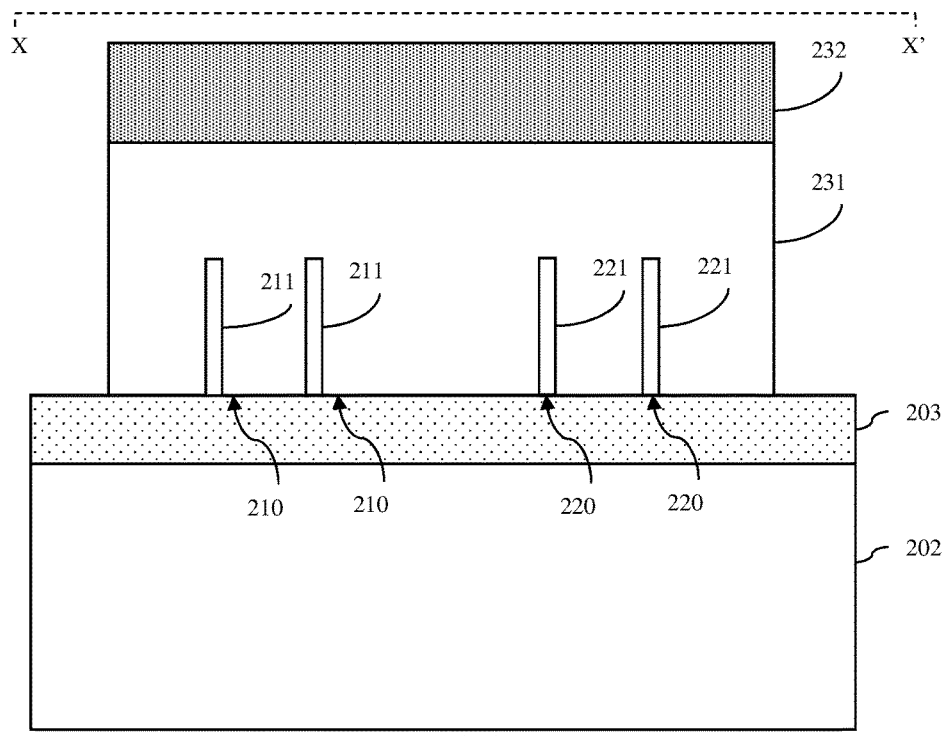

Referring again to the flow diagram of FIG. 1, in this method embodiment a semiconductor wafer can be provided and forming multiple semiconductor bodies on that semiconductor wafer (101-102, See FIGS. 2A-2B).

The semiconductor wafer provided at process 101 can be, for example, a semiconductor-on-insulator (SOI) wafer, as shown in FIG. 2B, that includes a semiconductor substrate 202 (e.g., a silicon substrate), an insulator layer 203 (e.g., a buried oxide (BOX) layer or other suitable insulator layer on the semiconductor substrate) and a semiconductor layer (e.g., a silicon layer or other suitable semiconductor layer) on the insulator layer 203. Alternatively, a bulk semiconductor wafer (e.g., a bulk silicon wafer or other suitable bulk semiconductor wafer) could be used.

At process 102, one or more first semiconductor bodies 210 for a first-type field effect transistor (e.g., an NFET) and one or more second semiconductor bodies 220 for a second-type field effect transistor (e.g., a PFET) can be formed, wherein each first semiconductor body 210 has areas designated for first source/drain regions 212 and a first channel region 211 positioned laterally between the first source/drain regions 212 and wherein each second semiconductor body 220 has areas designated for second source/drain regions 222 and a second channel region 221 positioned laterally between the second source/drain regions 222. As illustrated, these semiconductor bodies 210, 220 can be fin-shaped semiconductor bodies (i.e., relatively thin rectangular semiconductor bodies). Such fin-shaped semiconductor bodies can be patterned and etched from the semiconductor layer of the SOI wafer (or, alternatively, from the upper portion of a bulk semiconductor substrate, when isolation from the lower portion of the bulk semiconductor substrate is provided by buried well regions). Techniques for forming such fin-shaped semiconductor bodies (e.g., lithographic patterning techniques or sidewall image transfer techniques) are well known in the art and, thus, the details have been omitted from this specification in order to allow the reader to focus on the salient aspects of the disclosed method. It should be noted that the first channel regions 211 and the second channel regions 221 can be appropriately doped, either before or after formation of the semiconductor bodies, so that first channel regions 211 of the first-type FET (e.g., the NFET) have, for example, a second-type conductivity at a relatively low conductivity level (e.g., a P− conductivity) and so that the second channel regions 221 of the second-type FET (e.g., the PFET) have, for example, a first-type conductivity at a relatively low conductivity level (e.g., an N− conductivity).

A replacement metal gate, which has a dielectric cap and a dielectric sidewall spacer, can be formed across the first channel regions 211 of the first semiconductor bodies 210 and further across the second channel regions 221 of the second semiconductor bodies 220 (104).

Specifically, to form the replacement metal gate with the dielectric cap and dielectric sidewall spacer at process 104, a first sacrificial layer can be formed over the semiconductor bodies 210, 220 and a second sacrificial layer, which is different from the first sacrificial layer, can be formed on the first sacrificial layer. The first and second sacrificial layers can be patterned and etched to form a sacrificial gate 231 with a sacrificial cap 232, wherein the sacrificial gate 231 is adjacent to the first channel regions 211 and the second channel regions 221. For example, the sacrificial gate 231 can be immediately adjacent to the opposing sidewalls of the semiconductor bodies 210, 220 at the channel regions 211, 221 and, optionally, can be above the top surfaces of the semiconductor bodies 210, 220 at the channel regions 211, 221 such that the sacrificial gate 231 traverses the semiconductor bodies 210, 220 (see FIGS. 2A-2B).

Figure 3A:
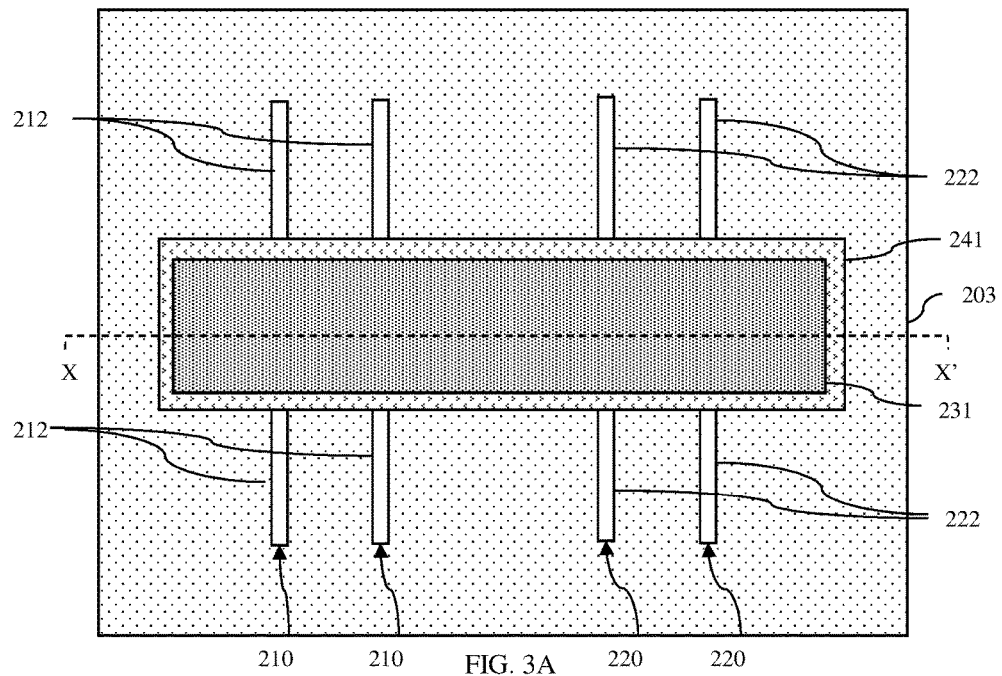
FIGS. 3A-3B are top view and cross section X-X' diagrams illustrating a partially completed structure formed according to the methods of FIG. 1.
Figure 3B:
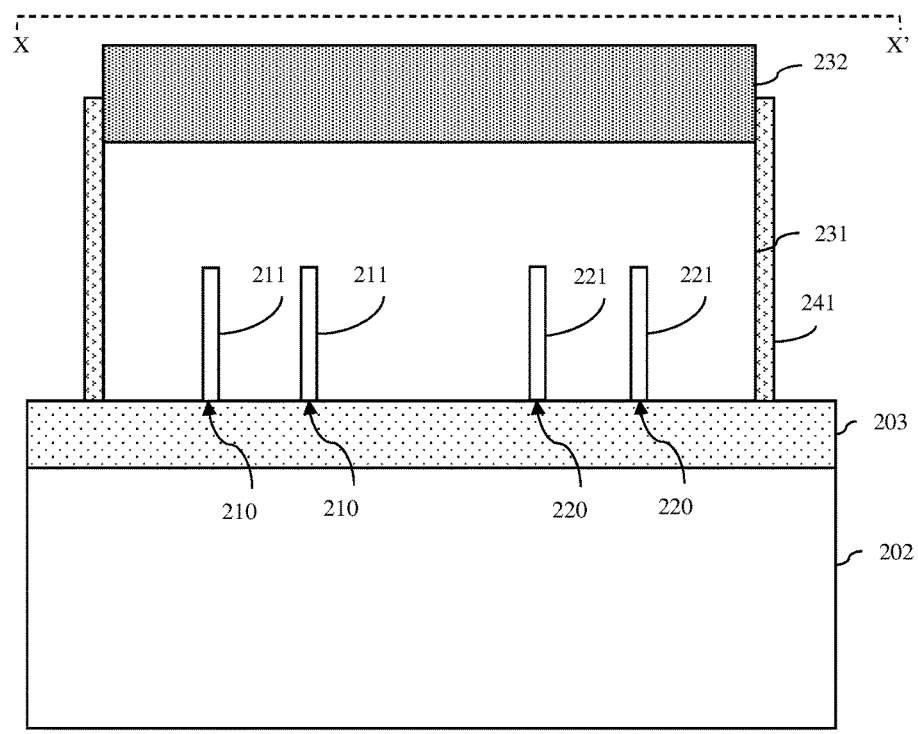

Next, a dielectric sidewall spacer 241 can be formed on the sidewalls of the sacrificial gate 231 (see FIGS. 3A-3B). That is, a relatively thin conformal dielectric layer can be deposited over the sacrificial gate 231 with its sacrificial cap 232 and further over the source/drain regions 212, 222 of the semiconductor bodies 210, 220 that extend laterally beyond the sacrificial gate 231. Then, a directional etch process can be performed so as to remove the conformal dielectric layer from horizontal surfaces and from the sidewalls of the source/drain regions 212, 222 of the semiconductor bodies 210, 220. Those skilled in the art will recognize that the height of the sacrificial cap 232 should be equal to or greater than the height of the semiconductor bodies 210, 220 so that the conformal dielectric layer can be removed from the sidewalls of the source/drain regions 212, 222 without exposing the sidewalls of the sacrificial gate 231.

Figure 4A:
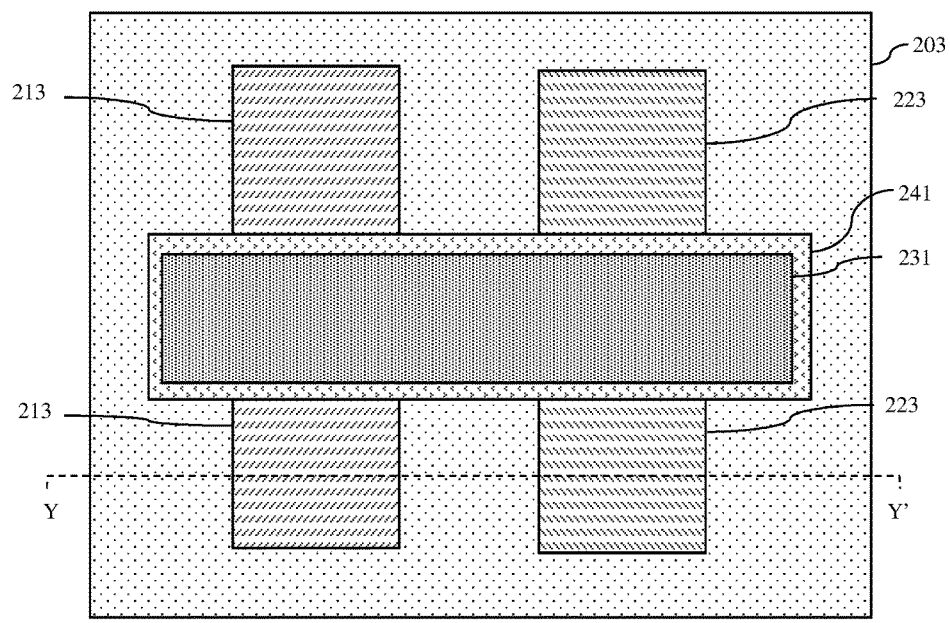
FIGS. 4A-4B are top view and cross section Y-Y' diagrams illustrating a partially completed structure formed according to the methods of FIG. 1.
Figure 4B:
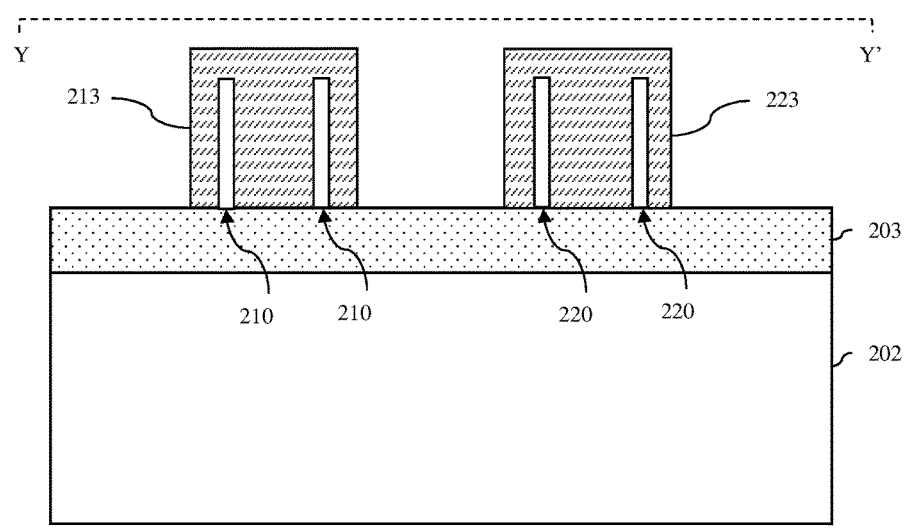
Figure 5A:
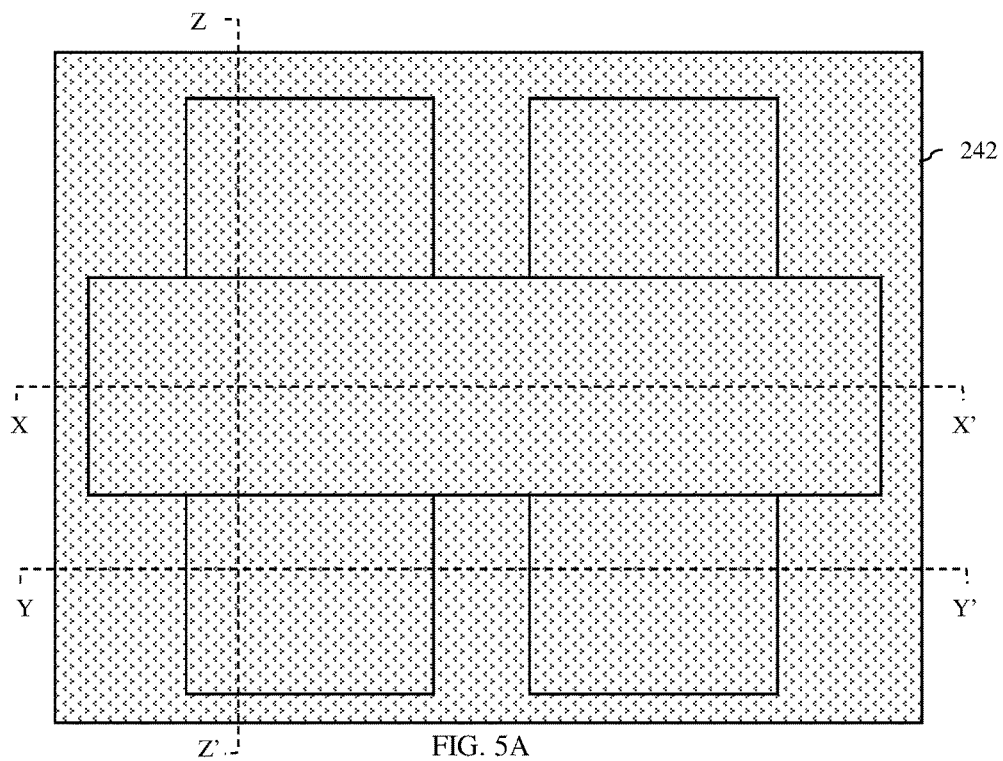
FIGS. 5A-5D are top view, cross section X-X', cross section Y-Y' and cross section Z-Z' diagrams illustrating a partially completed structure formed according to the methods of FIG. 1.
Figure 5B:
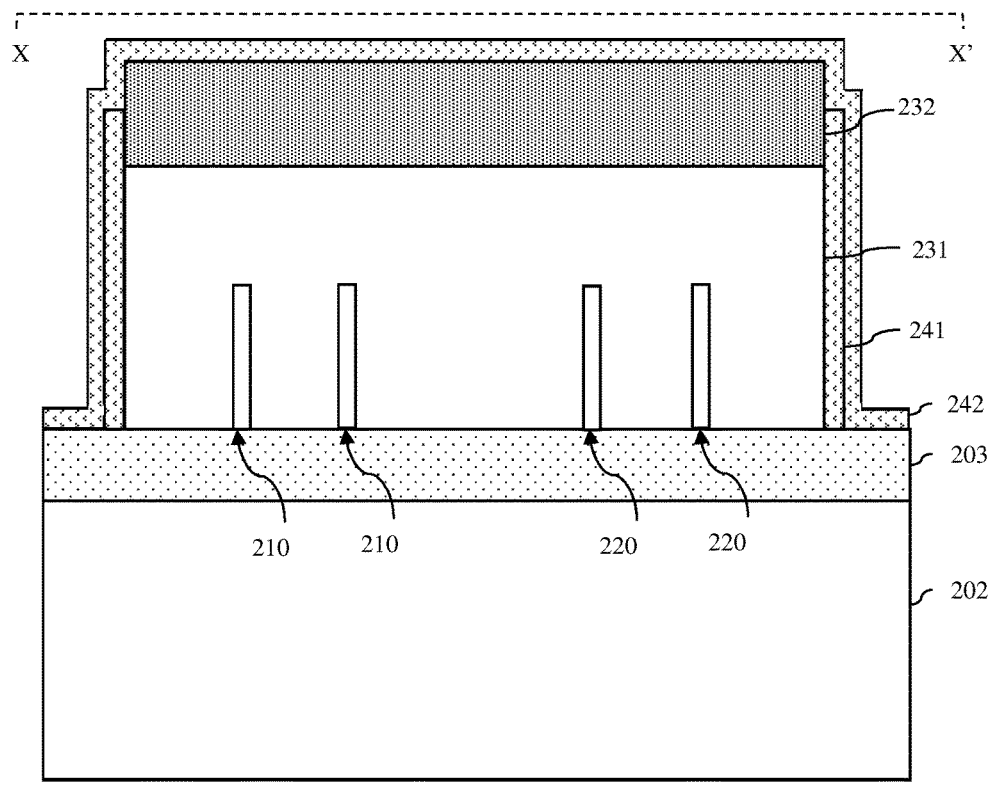
Figure 5C:
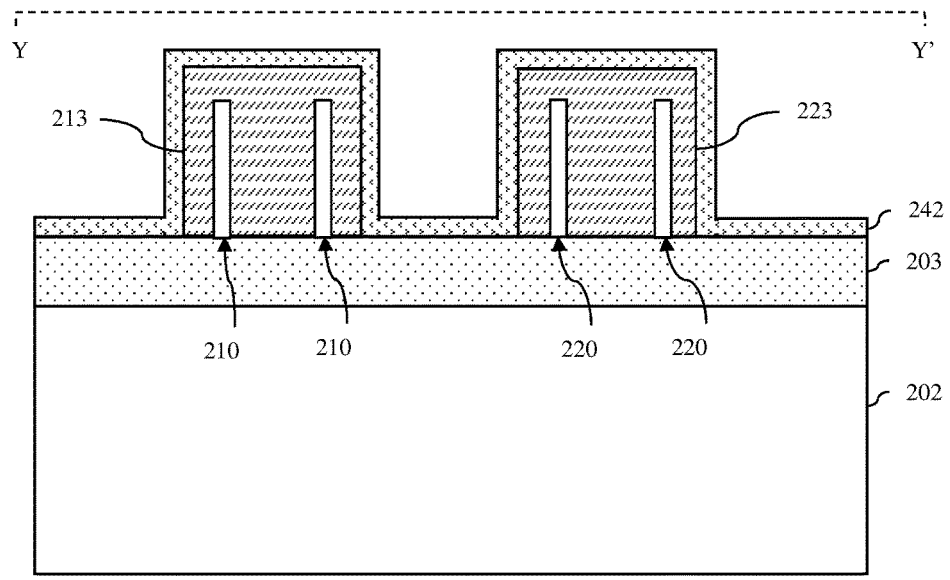
Figure 5D:
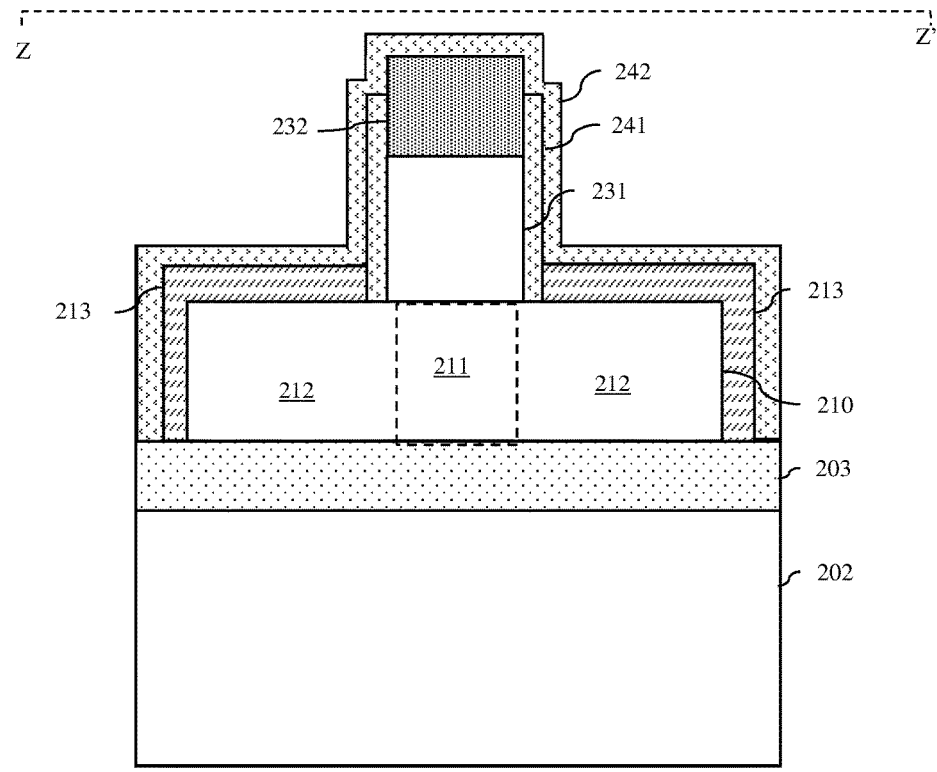
Figure 6A:
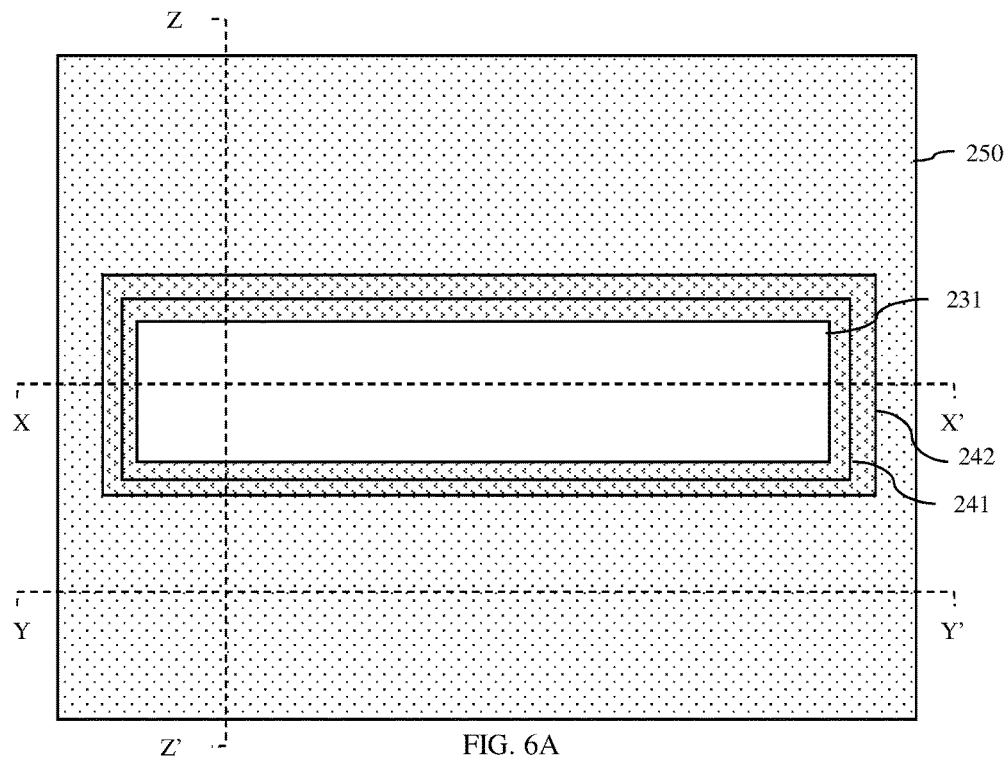
FIGS. 6A-6D are top view, cross section X-X', cross section Y-Y' and cross section Z-Z' diagrams illustrating a partially completed structure formed according to the methods of FIG. 1.
Figure 6B:
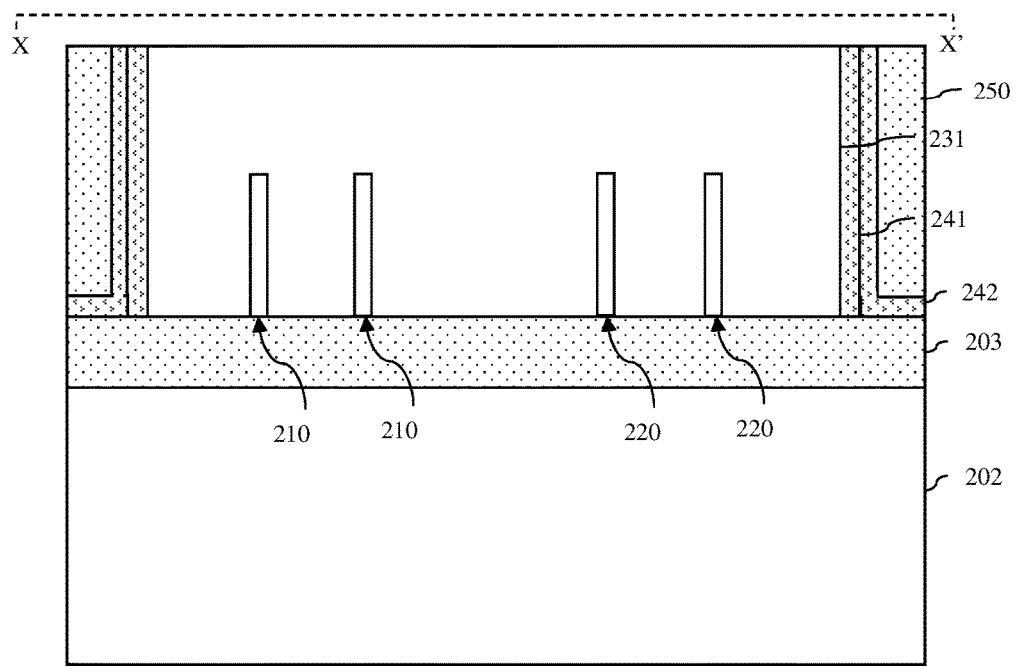
Figure 6C:
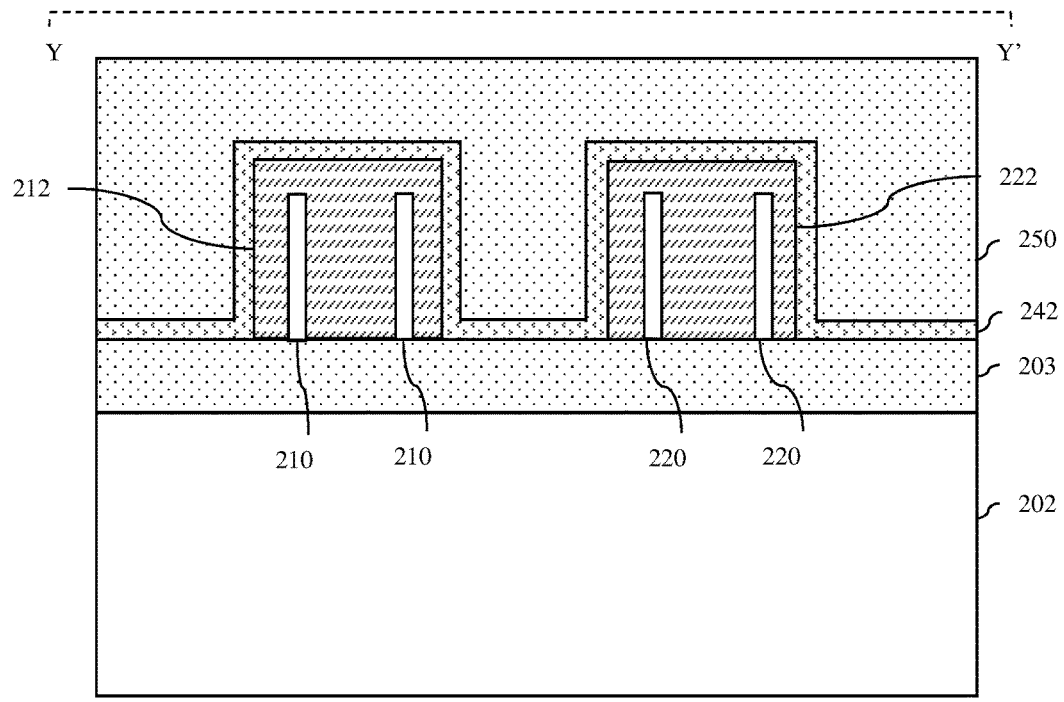
Figure 6D:
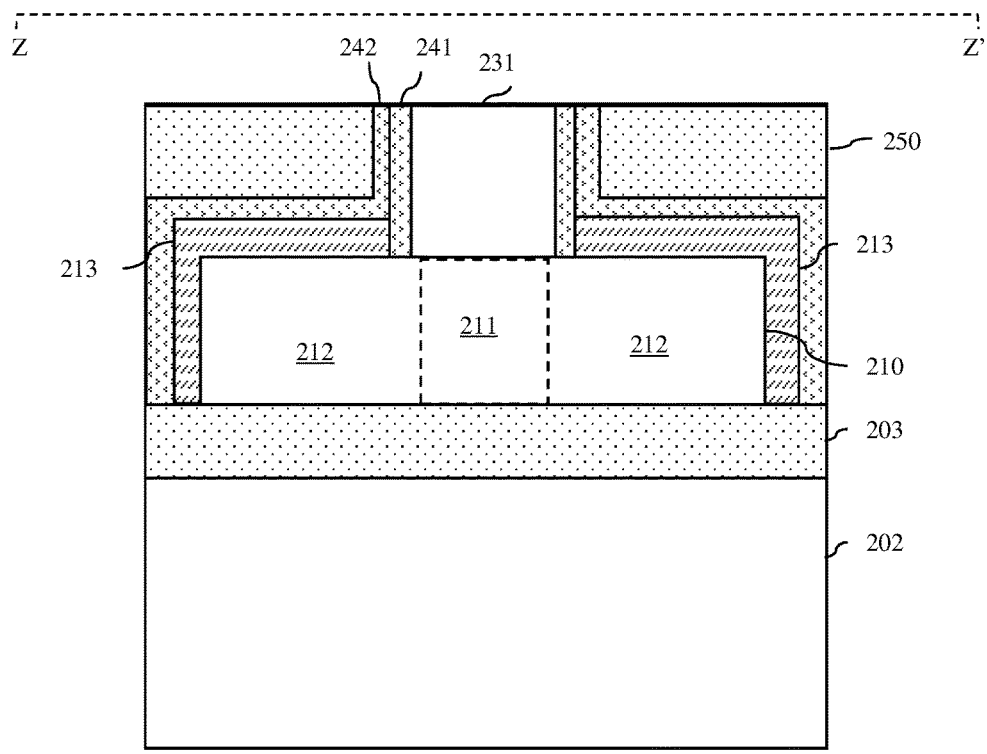

Optionally, epitaxial semiconductor material (e.g., epitaxial silicon or any other suitable epitaxial semiconductor material) can be deposited on exposed portions of the first semiconductor bodies (i.e., on the first source/drain regions 212) to form raised first source/drain regions 213 for the first-type field effect transistor on opposing sides of the sacrificial gate 231 and further on exposed portions of the second semiconductor bodies (i.e., on the second source/drain regions 222) to form raised second source/drain regions 223 for the second-type field effect transistor on the opposing sides of the sacrificial gate 231 (see FIGS. 4A-4B). Optionally, the epitaxial semiconductor material on adjacent first source/drain regions 212 can be merged into a single region and, similarly, the epitaxial semiconductor material on adjacent second source/drain regions 222 can be merged into a single region, as illustrated).

Optionally, masked dopant implantation processes can subsequently be performed to dope the first source/drain regions 212 (or, if applicable, the raised first source/drain regions 213) with a first dopant so as to have a first-type conductivity at a relatively high conductivity level (e.g., N+ conductivity) and to further dope the second source/drain regions 222 (or, if applicable, the raised second source/drain regions 223) with a second dopant so as to have a second-type conductivity at a relatively high conductivity level (e.g., P+ conductivity).

Following the masked dopant implantation processes, another conformal dielectric layer 242 can be deposited over the partially completed structure (see FIGS. 5A-5D). It should be noted that this conformal dielectric layer 242 could be made of the same dielectric material as that used to make the dielectric sidewall spacer 241 on the sacrificial gate 231.

After the conformal dielectric layer 242 is deposited, an additional dielectric layer 250 can be formed on the conformal dielectric layer 242 and then planarized (see FIGS. 6A-6D). Specifically, a blanket additional dielectric layer 250 can be deposited over the conformal dielectric layer 242 and then a chemical mechanical polishing (CMP) process can be performed in order to expose the top surface of the sacrificial gate 231. Optionally, before a CMP process is performed to expose the sacrificial gate 231, a CMP process can be performed to expose the sacrificial cap 232 and the additional dielectric layer 250 can be recessed. In this case, the removed dielectric material can be replaced with a material that is generally the same but with a different density (e.g., a greater density), which is more suitable for use with the CMP process that exposes the sacrificial gate 231.

Figure 7A:
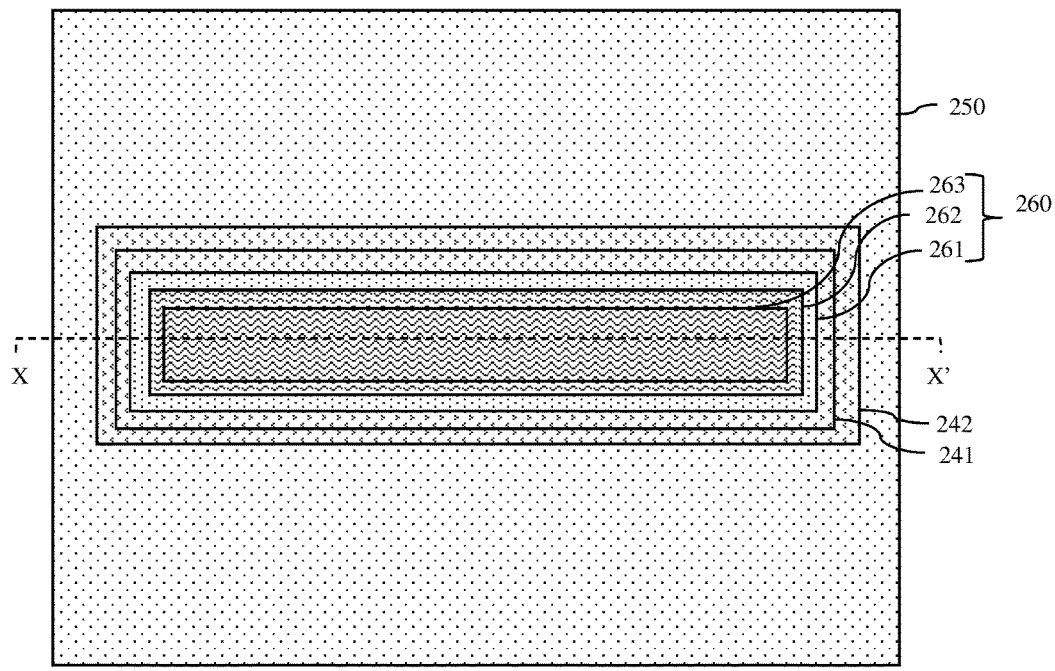
FIGS. 7A-7B are top view and cross section X-X' diagrams illustrating a partially completed structure formed according to the methods of FIG. 1.
Figure 7B:
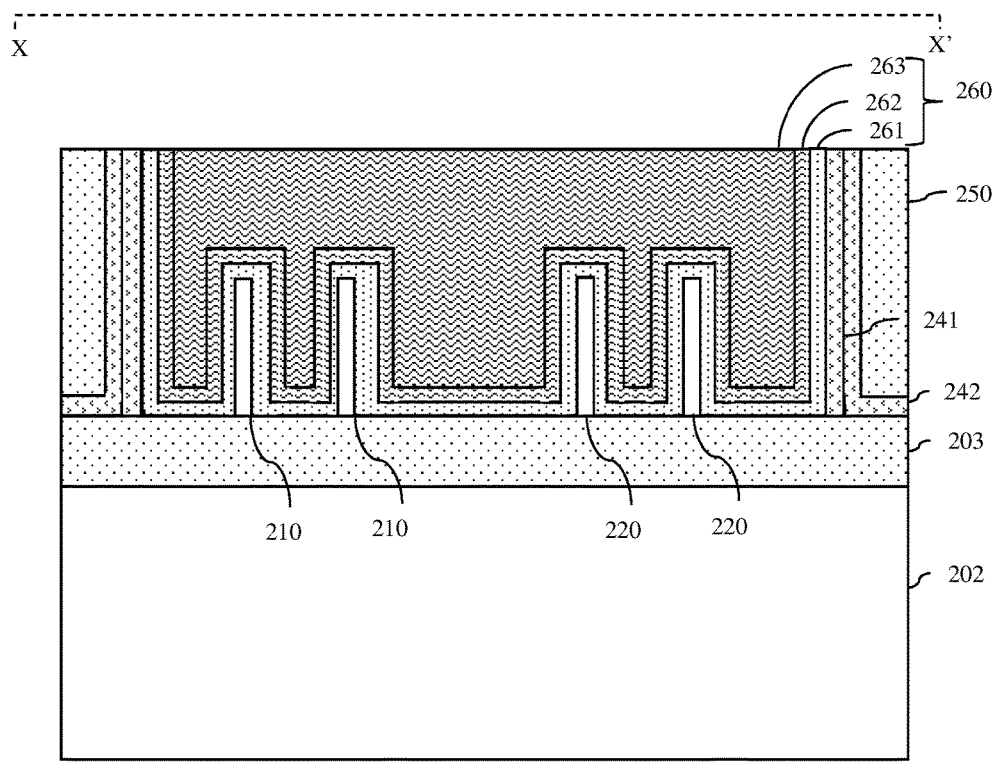

In any case, once the top surface of the sacrificial gate 231 is exposed, it can be selectively removed (e.g., using an etch process that selectively etches the sacrificial material of the sacrificial gate 231 over the dielectric materials of the dielectric sidewall spacer 241, conformal dielectric layer 242 and additional dielectric layer 250. After the sacrificial gate 231 is selectively removed, it can be replaced with a replacement metal gate 260 (see FIGS. 7A-7B). For example, after the sacrificial gate 231 is selectively removed, a conformal high-K gate dielectric layer 261 can be deposited so as to line the gate opening created by the removal of the sacrificial gate and one or more metal layers 262-263 can be deposited onto the gate dielectric layer 261. Although not shown, optionally, different gate dielectric layers and/or different metal layers can be used for a first portion of the replacement metal gate 260 over the first channel regions 211 as compared to a second portion of the replacement metal gate 260 over the second channel regions 221 (e.g., to achieve different work functions in the different portions of the gate). In any case, a chemical mechanical polishing (CMP) process can be performed to remove all gate materials from above the top surface of the additional dielectric layer 250.

Figure 8:
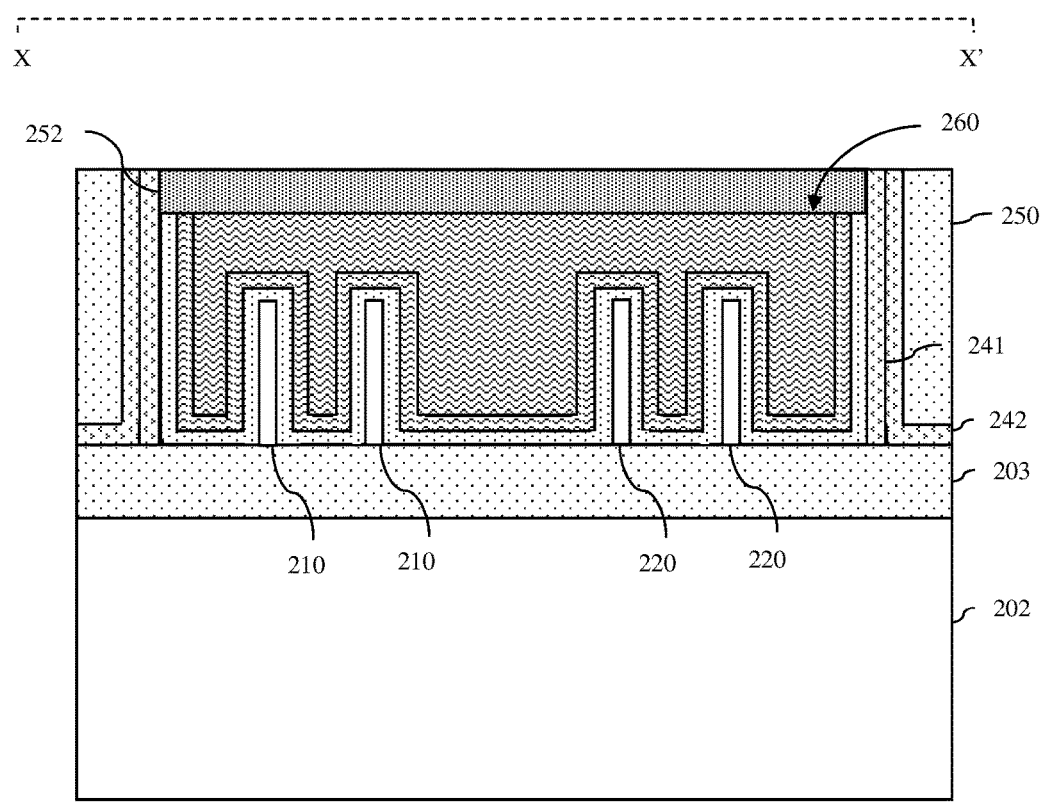
FIG. 8 is a cross section X-X' diagram illustrating a partially completed structure formed according to the methods of FIG. 1.

Once the replacement metal gate 260 is formed, it can be recessed and a first dielectric cap layer can be deposited and a CMP process can be performed, thereby forming a dielectric cap 252 on the replacement metal gate 260 (see FIG. 8). Thus, as illustrated, the replacement metal gate 260 formed at process 104 has both a dielectric cap 252 and a dielectric sidewall spacer 241.

Next, metal plugs having additional dielectric caps, respectively, can be formed on and, particularly, above the raised first source/drain regions 213 of the NFET and the raised second source/drain regions 223 of the PFET such that the dielectric sidewall spacer 241 and a vertical section of the conformal dielectric layer 242 are positioned laterally between the metal plugs and the gate 260 and further between the additional dielectric caps and the dielectric cap 252 (106).

Figure 9A:
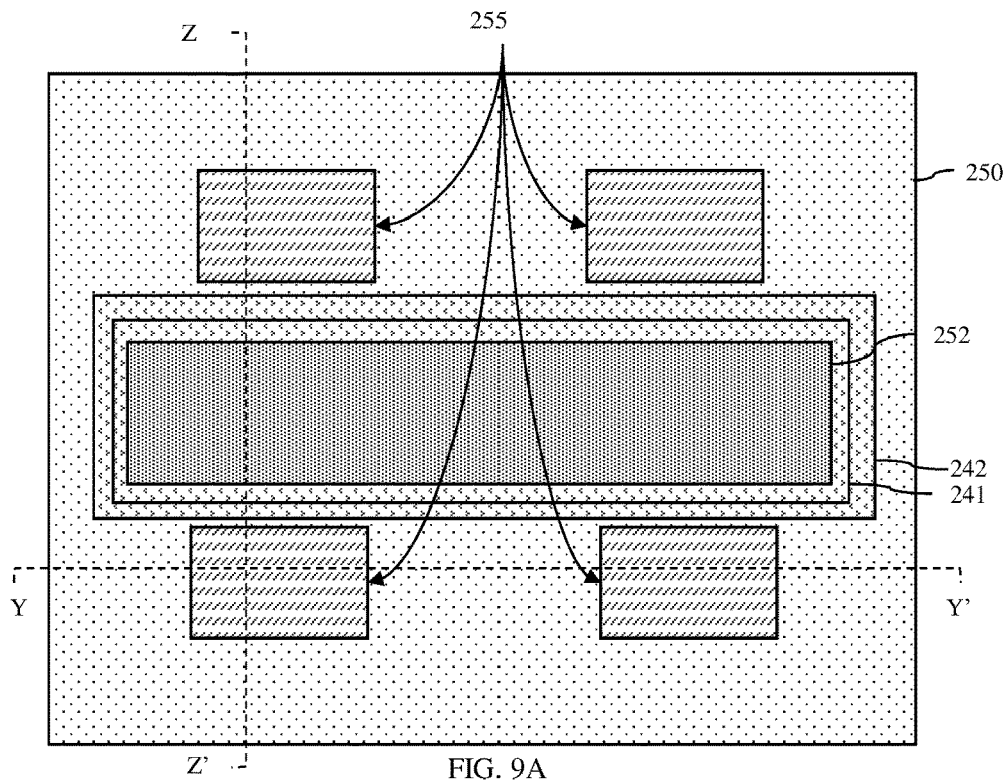
FIGS. 9A-9C are top view, cross section Y-Y' and cross section Z-Z' diagrams illustrating a partially completed structure formed according to the methods of FIG. 1.
Figure 9B:
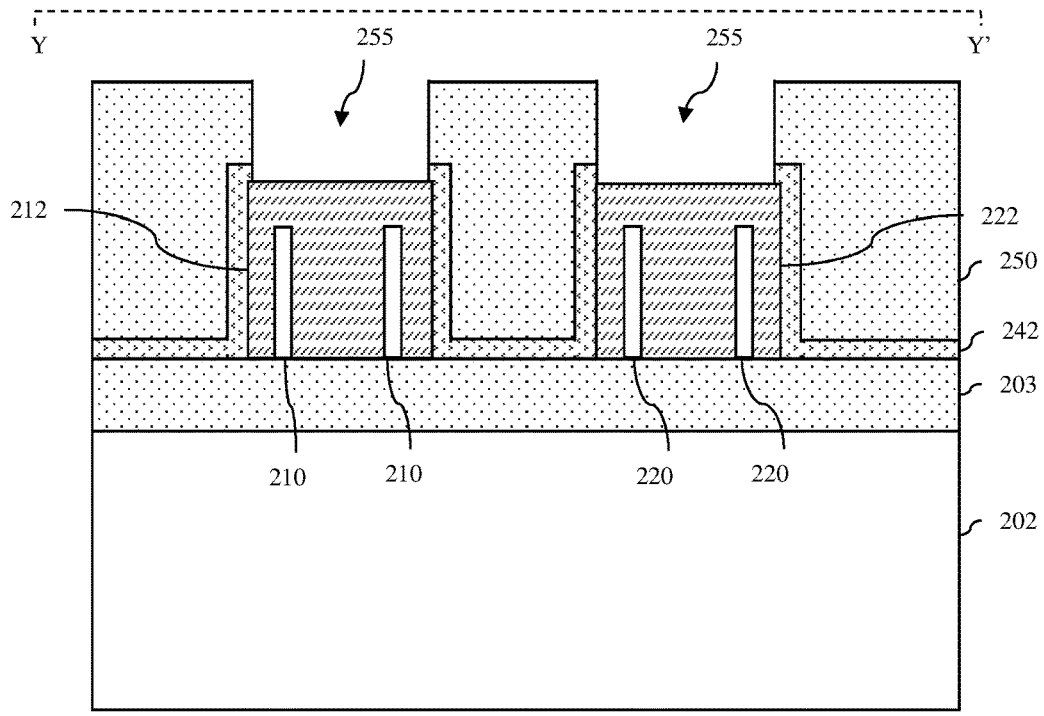
Figure 9C:
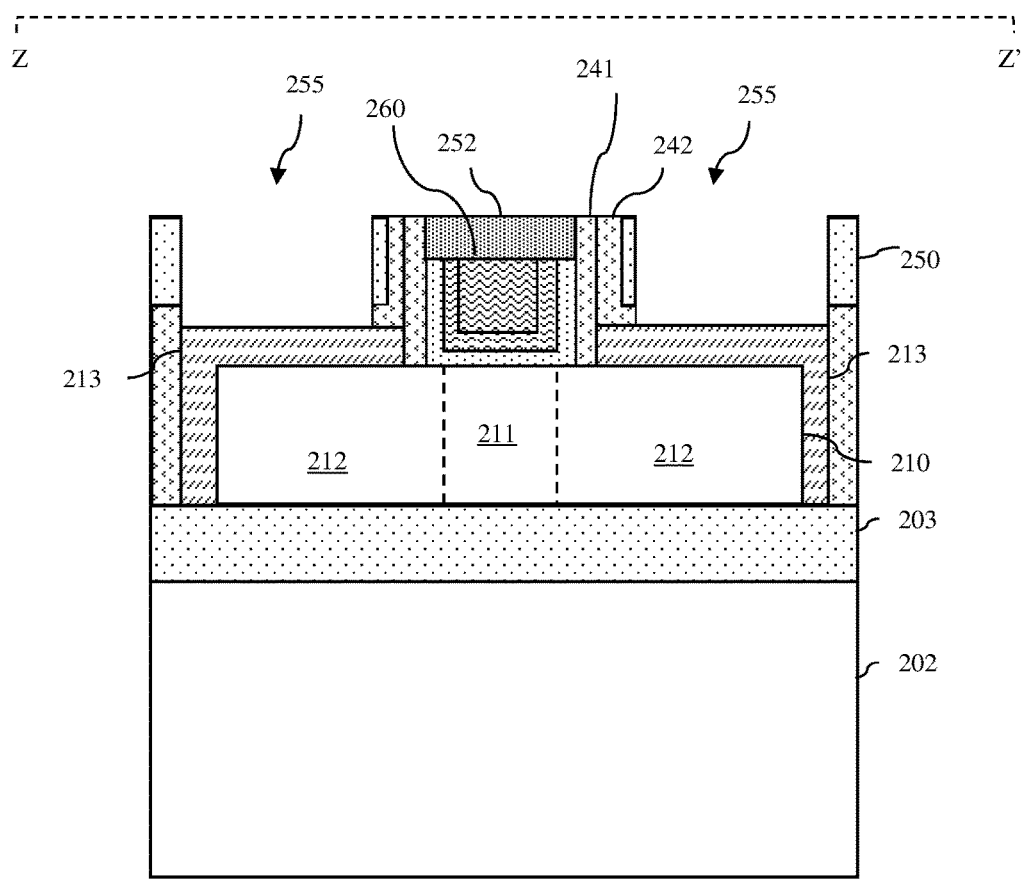
Figure 10A:
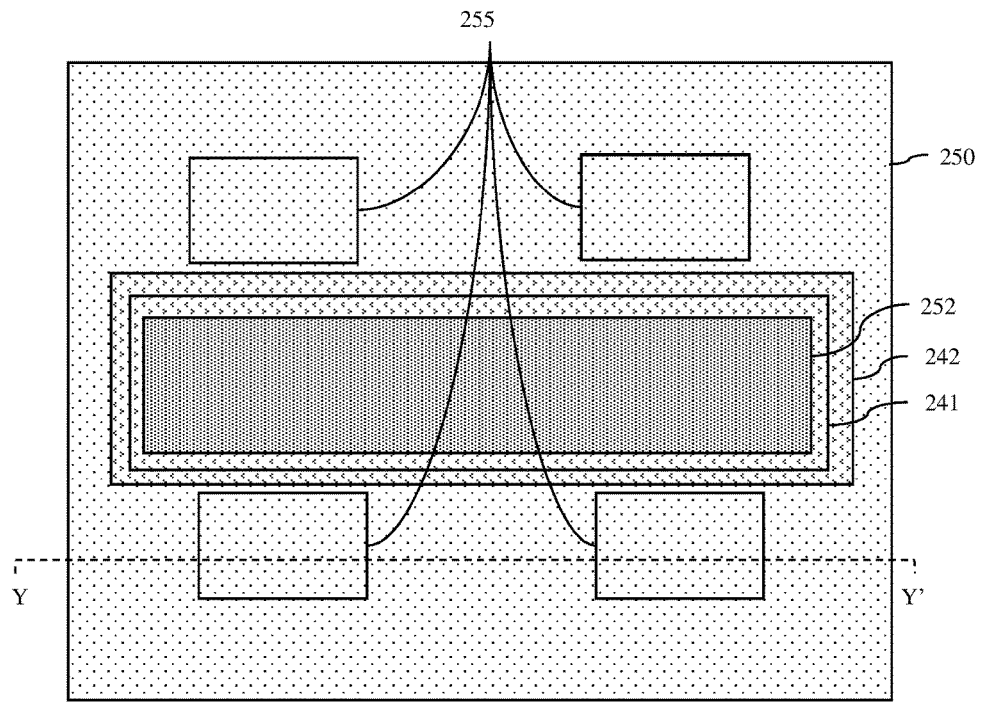
FIGS. 10A-10B are top view and cross section Y-Y' diagrams illustrating a partially completed structure formed according to the methods of FIG. 1.
Figure 10B:
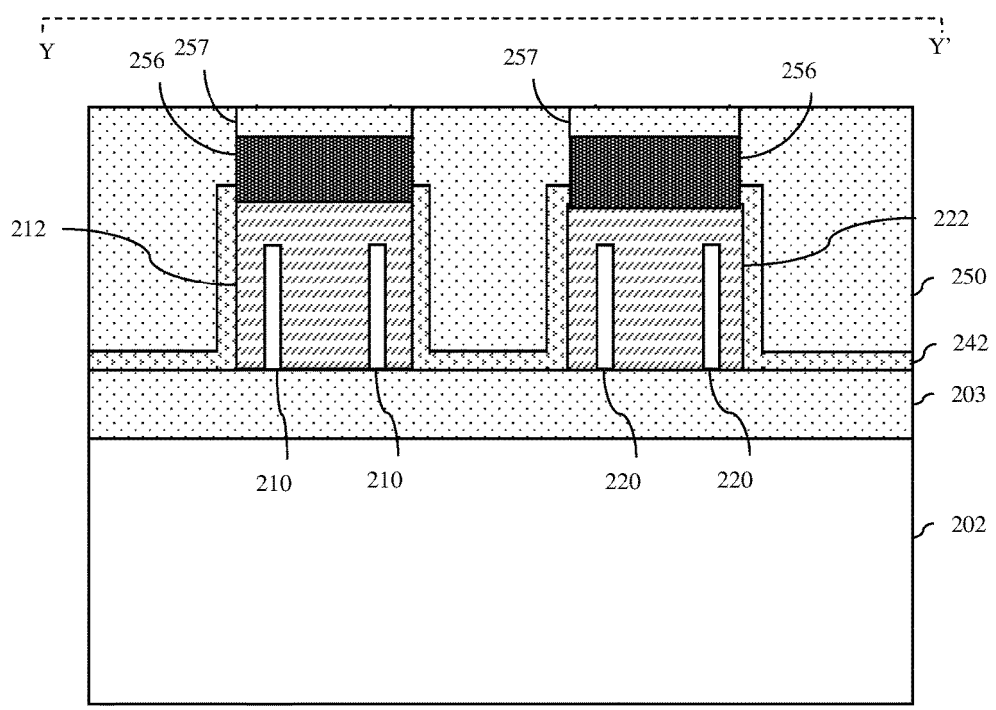

Specifically, to form the metal plugs having additional dielectric caps at process 106, metal plug openings 255 can be formed (e.g., lithographically patterned and etched) through the additional dielectric layer 250 and the conformal dielectric layer 242 to the raised first source/drain regions 213 and the raised second source/drain regions 223 (see FIGS. 9A-9C). Then, the metal plugs 256 (e.g., tungsten or cobalt plugs) having the additional dielectric caps 257 can be formed in the metal plug openings 255 (see FIGS. 10A-10B). That is, a metal layer (e.g., a tungsten or cobalt layer) can be deposited into the metal plug openings 255 and recessed, thereby forming the metal plugs 256. After the metal layer is recessed, a second dielectric cap layer can be deposited and a CMP process can be performed, thereby forming additional dielectric caps 257 on the metal plugs 256 and ensuring that the dielectric cap 252 (which is formed above and immediately adjacent to the top surface of the replacement metal gate 260), the dielectric sidewall spacer 241 (which is formed immediately adjacent to the sidewalls of the sacrificial gate and which remains in place on the sidewalls of the replacement metal gate 260), the vertical section of the conformal dielectric layer 242 (which is positioned laterally adjacent to the dielectric sidewall spacer 241), the additional dielectric caps 257 (which are formed above and immediately adjacent to the metal plugs 256) and the additional dielectric layer 250 all have approximately co-planar top surfaces. Those skilled in the art will recognize that, while ideally the top surfaces of the dielectric cap, dielectric sidewall spacer and additional dielectric caps will be perfectly co-planar following CMP, variations in the reactions of the different dielectric materials to the chemical and/or mechanical forces imparted thereon may result in the levels of the top surfaces of these features being slightly varied.

It should be noted that, at processes 104-106, the dielectric cap 252, the dielectric sidewall spacer 241, and the additional dielectric caps 257 should all made of different dielectric materials. Additionally, the conformal dielectric layer 242 can be made of the same dielectric material as the dielectric sidewall spacer 241 and the additional dielectric layer 250 can be made of the same dielectric material as the additional dielectric caps 257. The various dielectric materials can be preselected so that, during subsequent processing (e.g., see process steps 110-114, discussed in greater detail below), the dielectric cap 252 is selectively etchable over the dielectric sidewall spacer 241, the conformal dielectric layer 242 and the additional dielectric caps 257 and so that the additional dielectric caps 257 are selectively etchable over the dielectric sidewall spacer 241, the conformal dielectric layer 242 and the dielectric cap 252. Exemplary dielectric materials can include, for example, silicon nitride for the dielectric cap 252, silicon carbon oxide for the dielectric sidewall spacer 241 and the conformal dielectric layer 242 and silicon oxide for the additional dielectric caps 25 and the additional dielectric layer 250. Alternatively, any other suitable dielectric materials could be used.

Subsequently, an interlayer dielectric (ILD) material 280 can be deposited such that it covers the dielectric cap 252, dielectric sidewall spacer 241, the vertical section of the conformal dielectric layer 242 (which is positioned laterally adjacent to the dielectric sidewall spacer 241), and additional dielectric caps 257 (108). The ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.). After the ILD material is deposited, another CMP process can be performed.

To complete the IC structure, both middle of the line (MOL) contacts and back end of the line (BEOL) metal levels can be formed (110). The MOL contacts can include at least one first contact to the replacement metal gate 260 (referred to herein as a gate contact). The first contact can, for example, be formed so as to be aligned above the active region of the FETs being formed (as illustrated) or close thereto (e.g., aligned above a portion of the gate in close proximity to the active region or aligned above a portion of the gate in close proximity to any metal plugs). The MOL contacts can also include second contacts (referred to herein as source/drain contacts) to the metal plugs 256. It should be noted that formation of a first contact openings for the first contact and second contact openings for the second contacts at process 110 should be performed using separate etch processes.

Figure 11A:
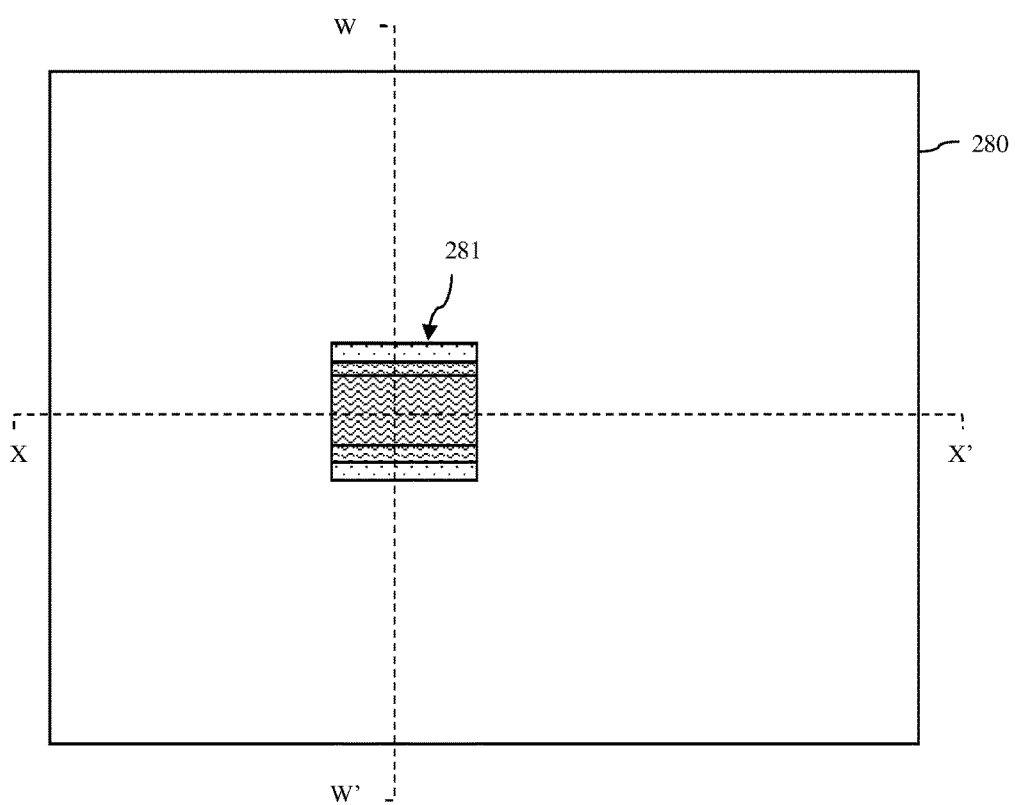
FIGS. 11A-11C are top view, cross section X-X' and cross section W-W' diagrams illustrating a partially completed structure formed according to the methods of FIG. 1.
Figure 11B:
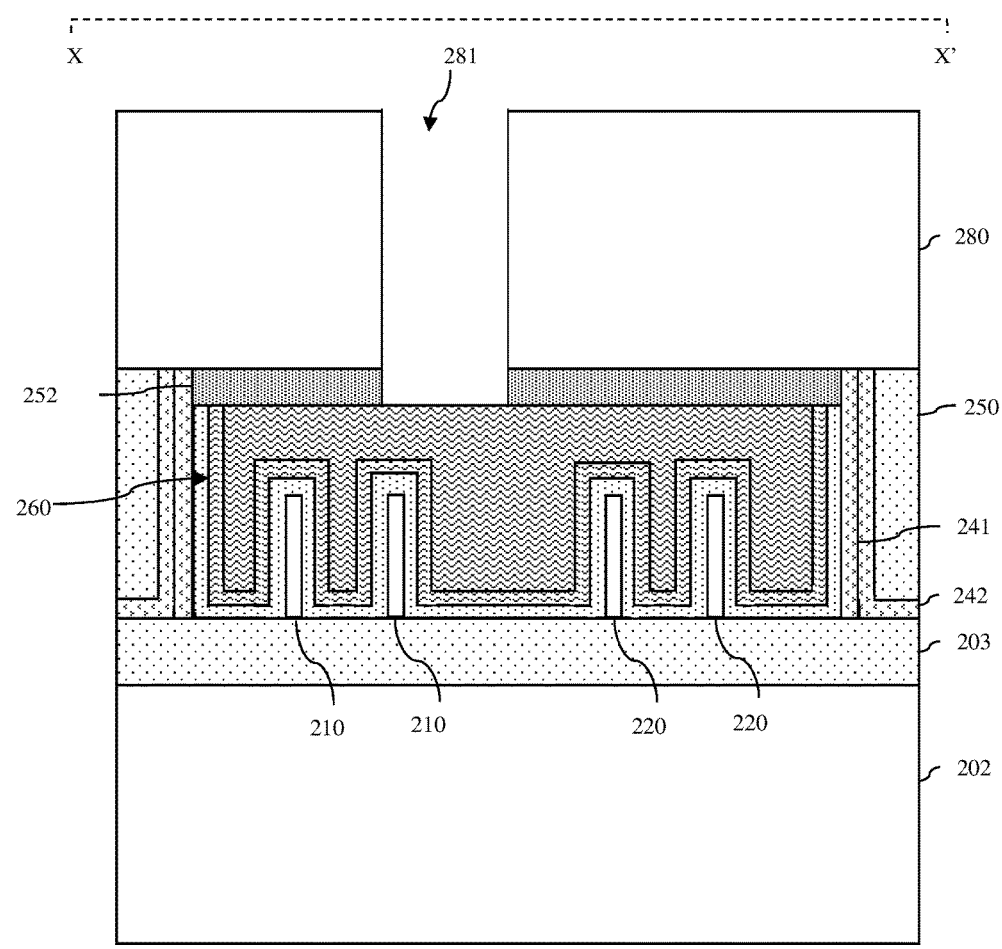
Figure 11C:
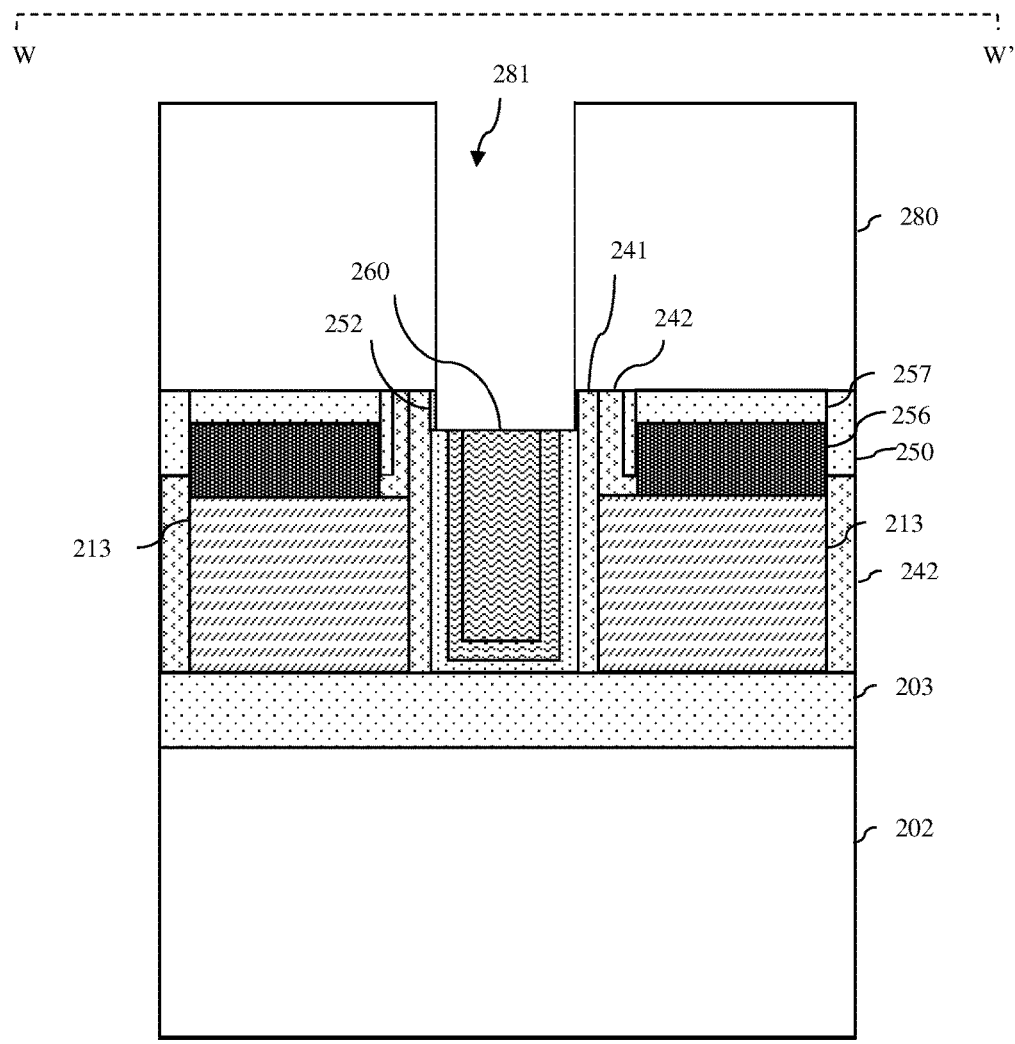
Figure 12:
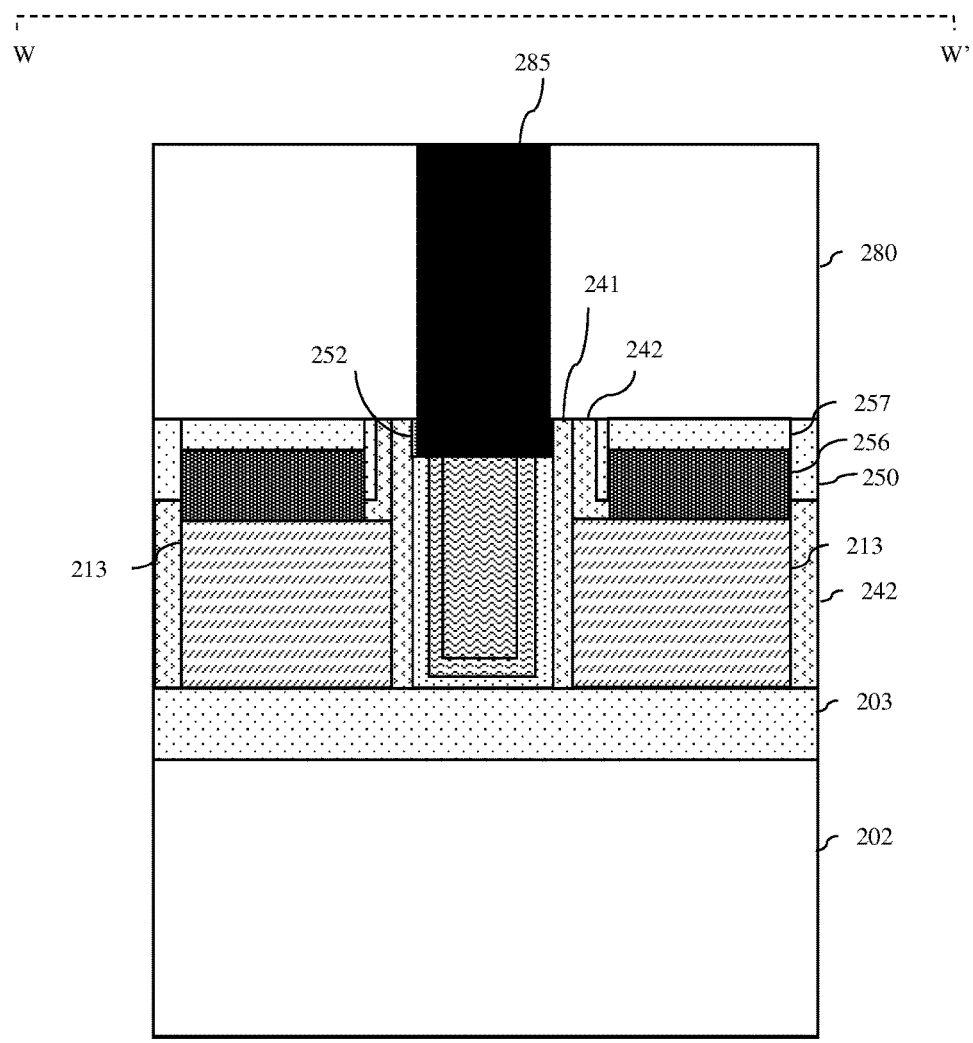
FIG. 12 is a cross section W-W' diagram illustrating a portion of a completed structure formed according to the methods of FIG. 1.
Figure 13A:
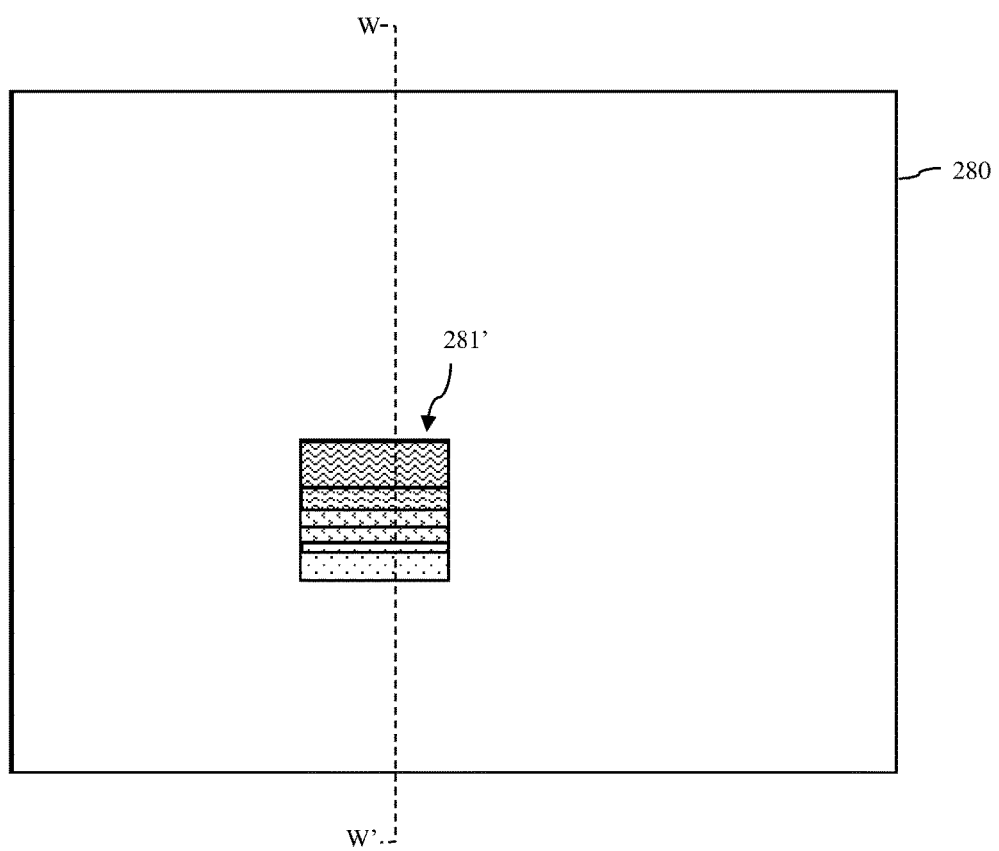
FIGS. 13A-13B are top view and cross section W-W' diagrams illustrating a partially completed structure formed according to the methods of FIG. 1.
Figure 13B:
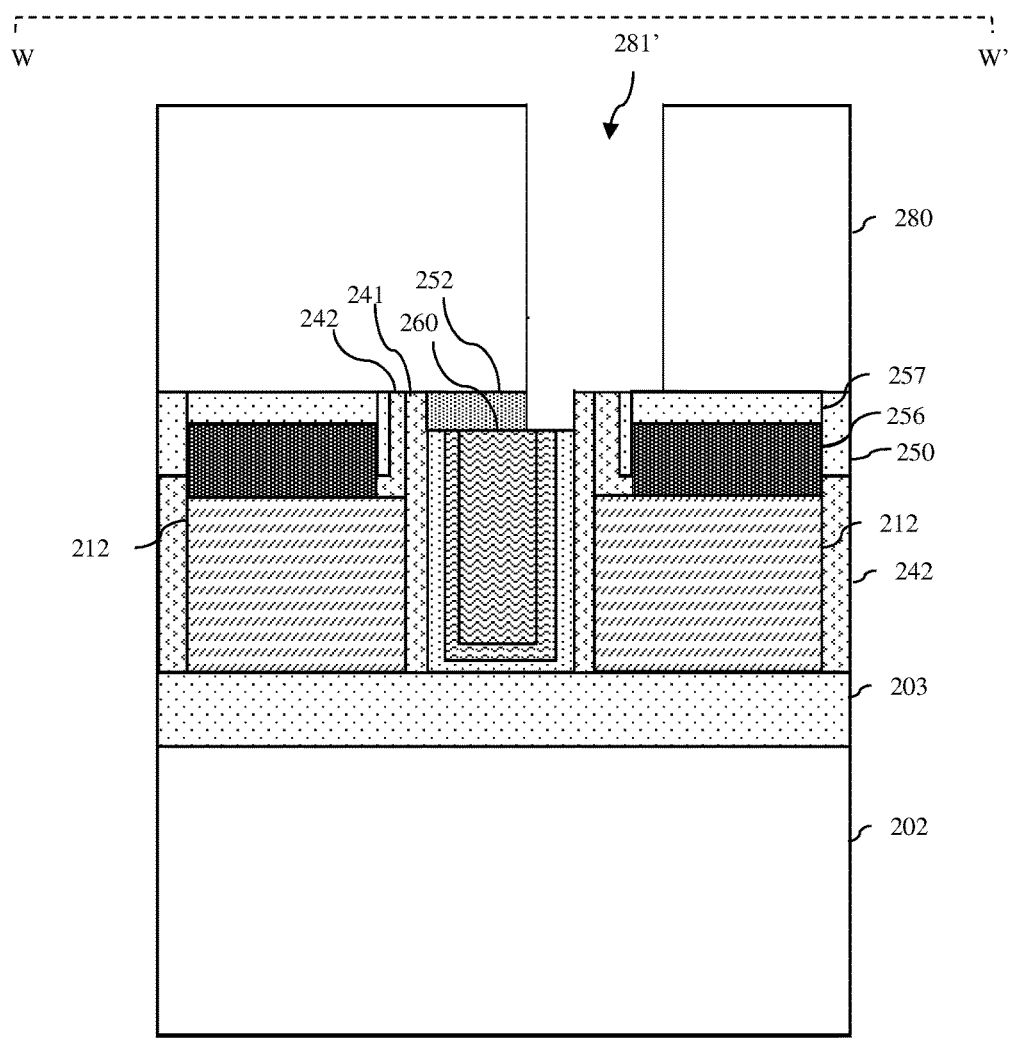
Figure 14:
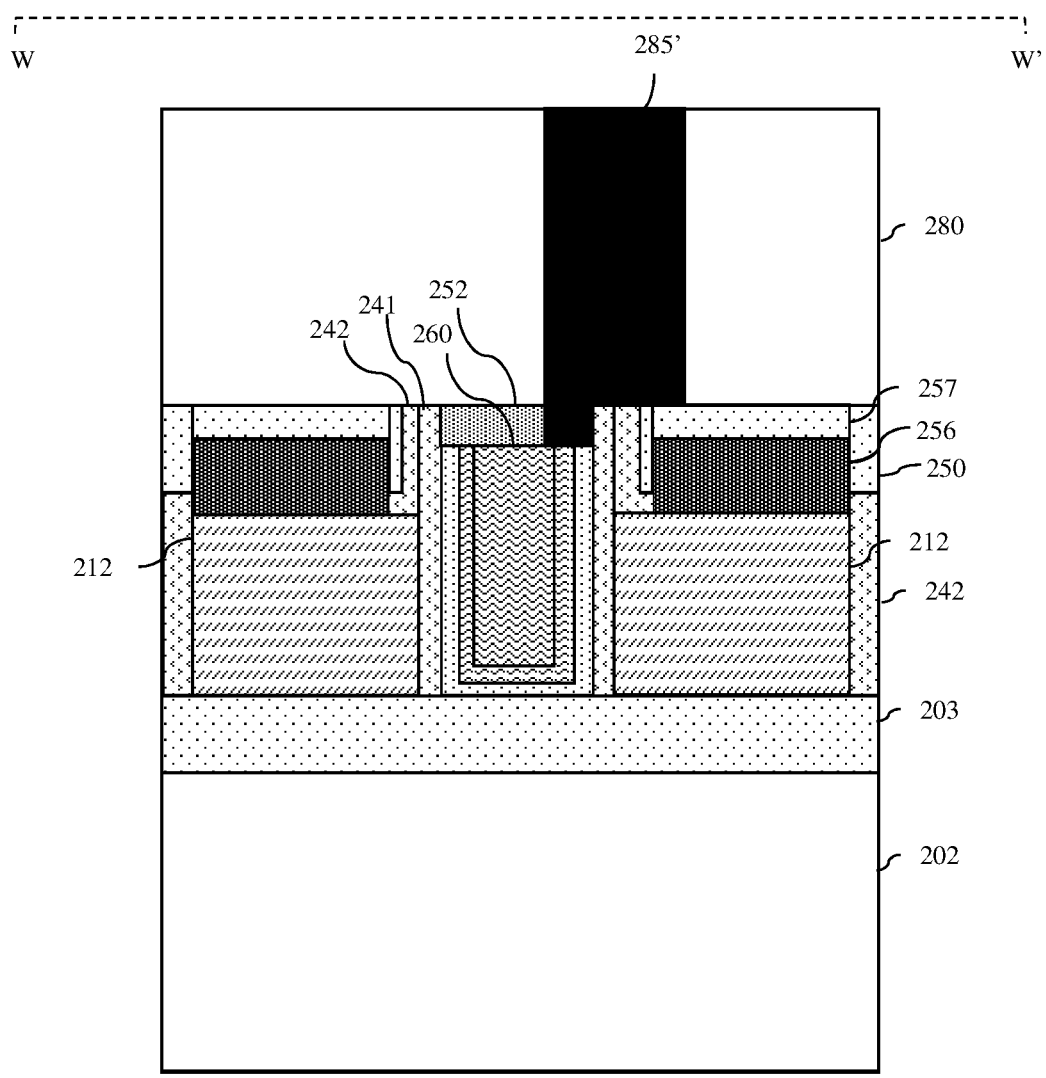
FIG. 14 is a cross section W-W' diagram illustrating a portion of a completed structure formed according to the methods of FIG. 1.

For example, a first contact opening 281 for a first contact to the replacement metal gate 260 can be formed through the ILD material 280 and the dielectric cap 252 to the replacement metal gate 260 using an etch process that is selective to the material of the dielectric cap 252 (e.g., selective to silicon nitride) over the materials of the dielectric sidewall spacer 241 and conformal dielectric layer 242 and the additional dielectric caps 257 (e.g., over silicon carbon oxide and silicon oxide) (112, see FIGS. 11A-11C). For purposes of illustration, only a single first contact opening 281 is shown. However, it should be understood that any number of one or more first contact openings could be formed to the replacement metal gate 260. In any case, the first contact opening 281 can be filled with conductive material (e.g., tungsten, cobalt, copper, or any other suitable conductive material), thereby forming a first contact 285 (see FIG. 12). Since the dielectric cap 252 on the replacement metal gate 260 is selectively etchable over the dielectric sidewall spacer 241, the conformal dielectric layer 242 and the additional dielectric caps 257, the first contact 285 will be self-aligned to the replacement metal gate 260 (i.e., will be a self-aligned first contact), regardless of whether any misalignment occurs, and the risk of exposure of any of the metal plugs 256 that could result in shorting between the first contact 285 and the metal plugs 256 is avoided (or at least significantly reduced). For example, referring to the misaligned first contact opening 281' shown in FIGS. 13A-13B, when the first contact opening 281' is offset from the replacement metal gate 260 (e.g., due to overlay control issues) such that it has a first portion that overlaps the replacement metal gate 260 and a second portion that overlaps a metal plug 256, etching of the second portion will stop on the additional dielectric cap 257, on the vertical section of the conformal dielectric layer 242 and on the dielectric sidewall spacer 241 and etching of the first portion will continue through the dielectric cap 252 stopping on the replacement metal gate 260. Thus, the first portion of the misaligned first contact opening 281' will be deeper than the second portion and the method thereby provides protection against the development of a short between the misaligned first contact 285' and the metal plug 256 upon filling of the misaligned first contact opening 281' with conductive material (as shown in FIG. 14).

Figure 15A:
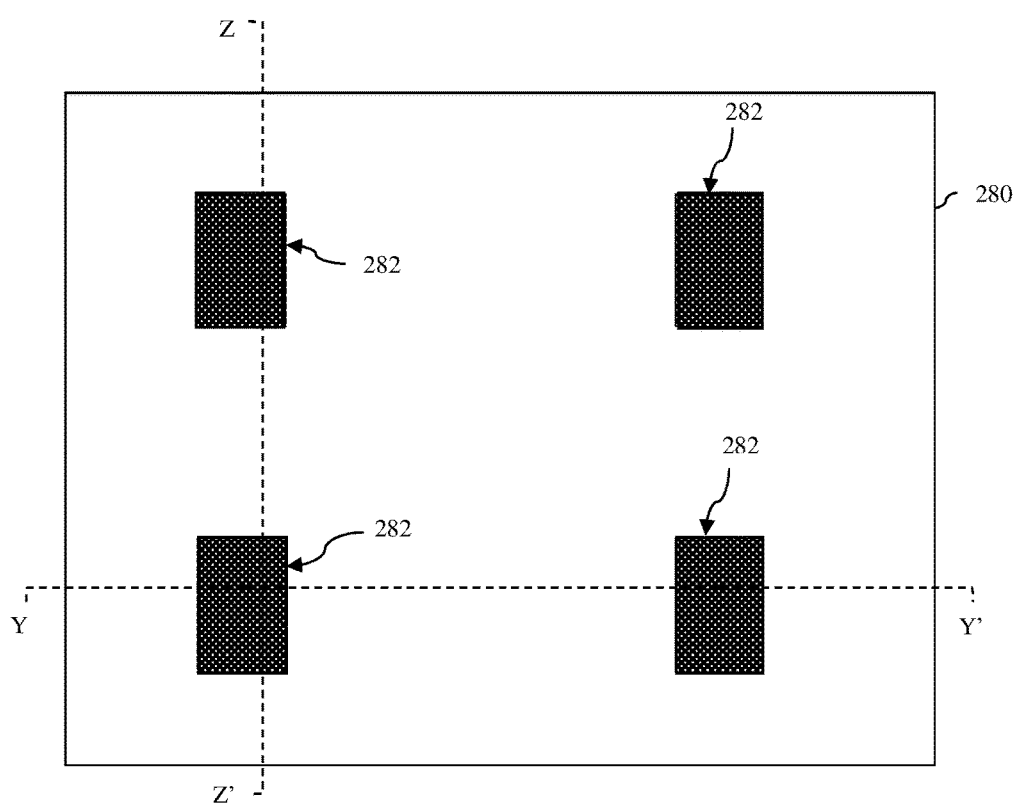
FIGS. 15A-15C are top view, cross section Y-Y' and cross section Z-Z' diagrams illustrating a partially completed structure formed according to the methods of FIG. 1.
Figure 15B:
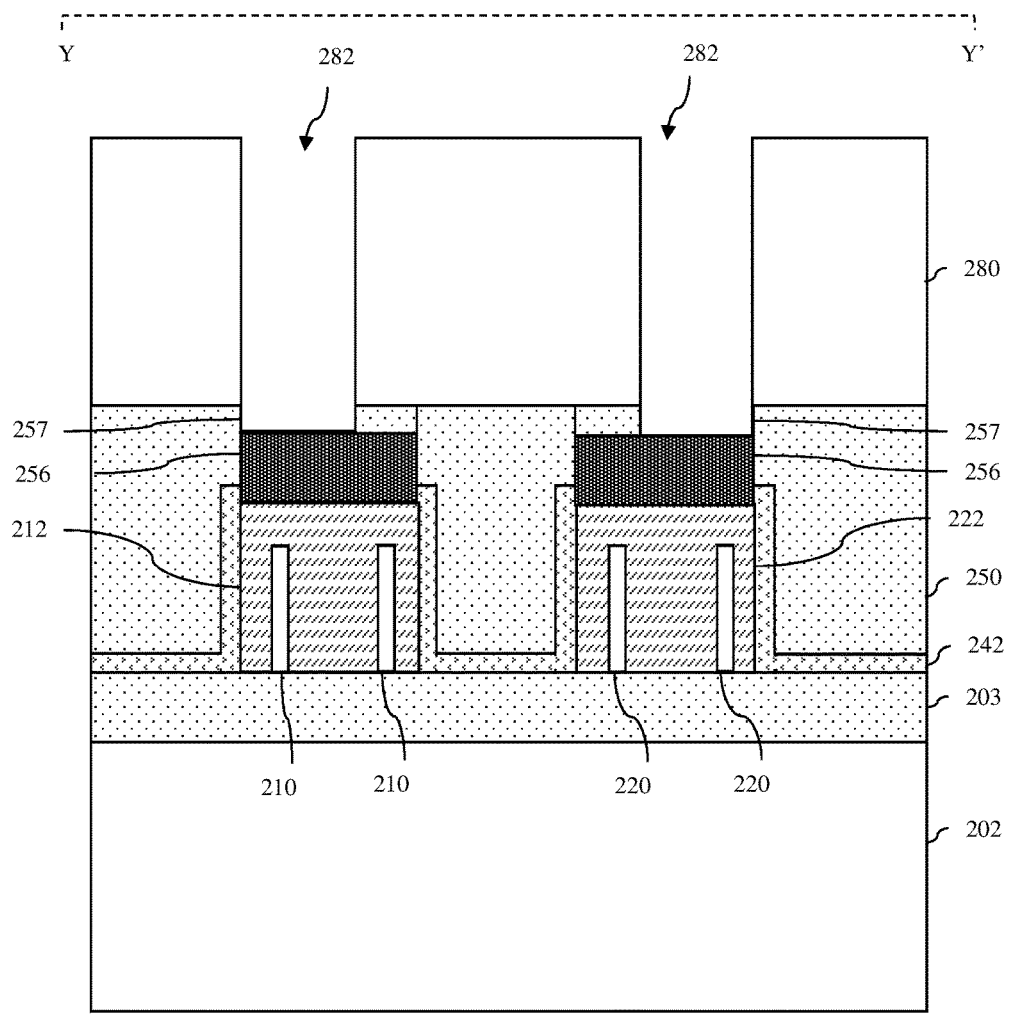
Figure 15C:
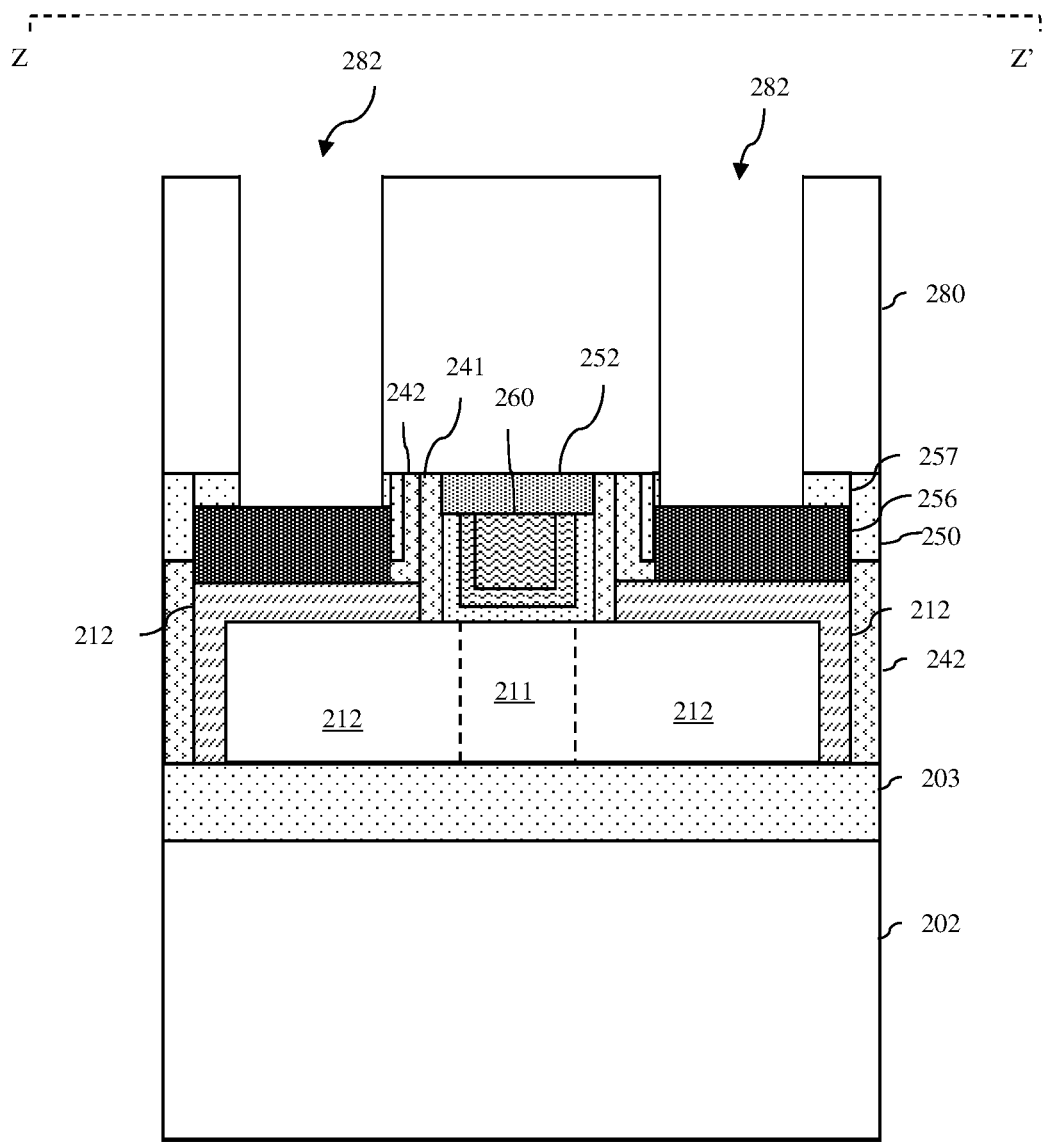
Figure 16:
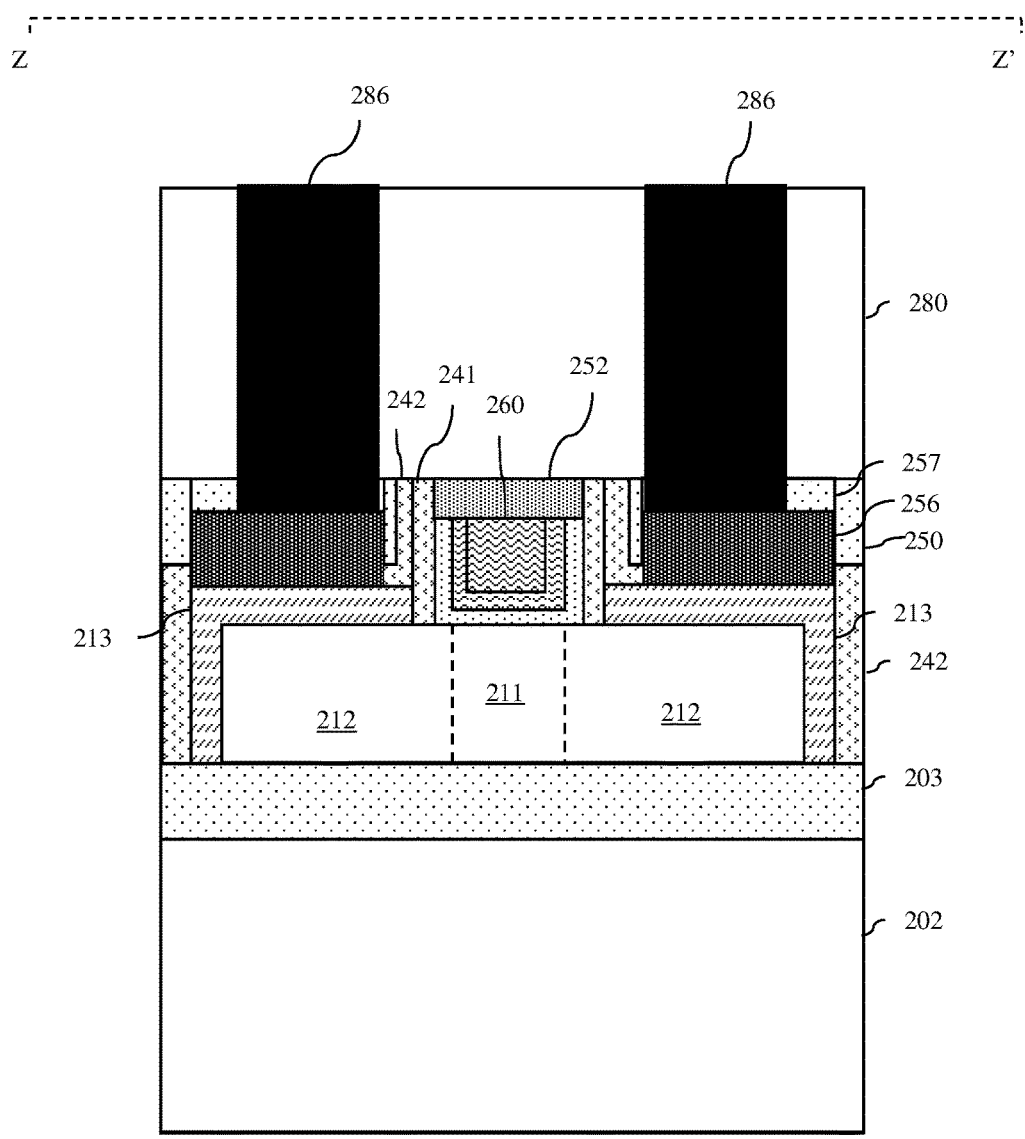
FIG. 16 is a cross section Z-Z' diagram illustrating a portion of a completed structure formed according to the methods of FIG. 1.
Figure 17A:
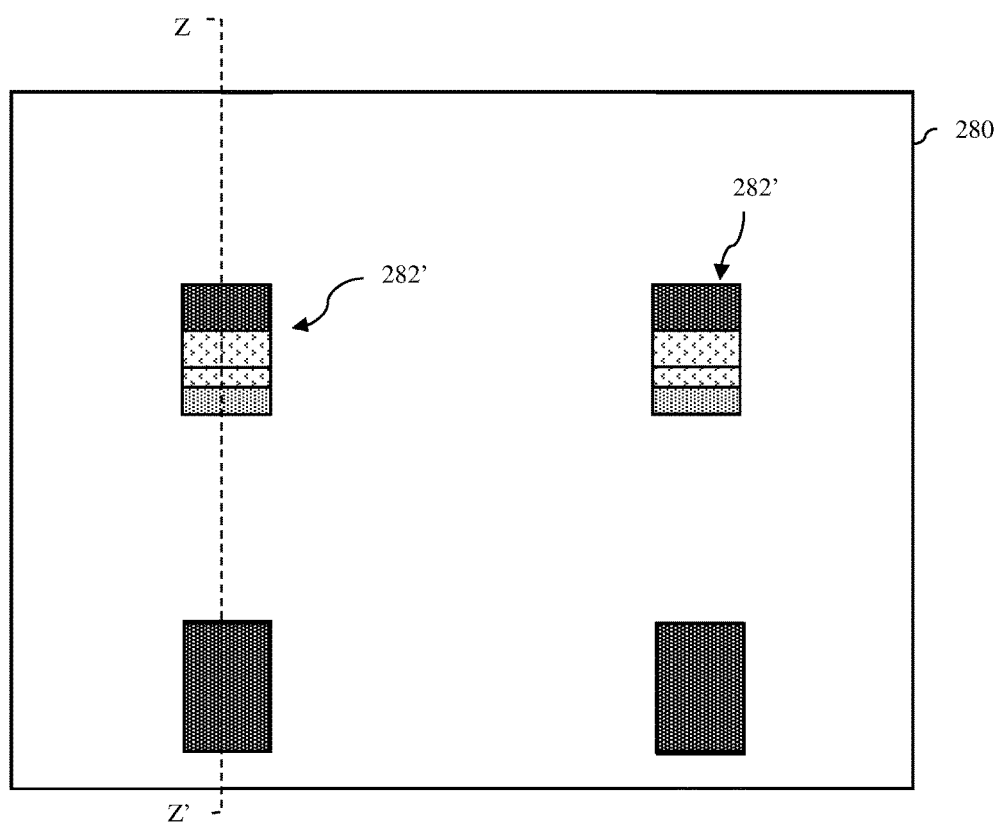
FIGS. 17A-17B are top view and cross section Z-Z' diagrams illustrating a partially completed structure formed according to the methods of FIG. 1.
Figure 17B:
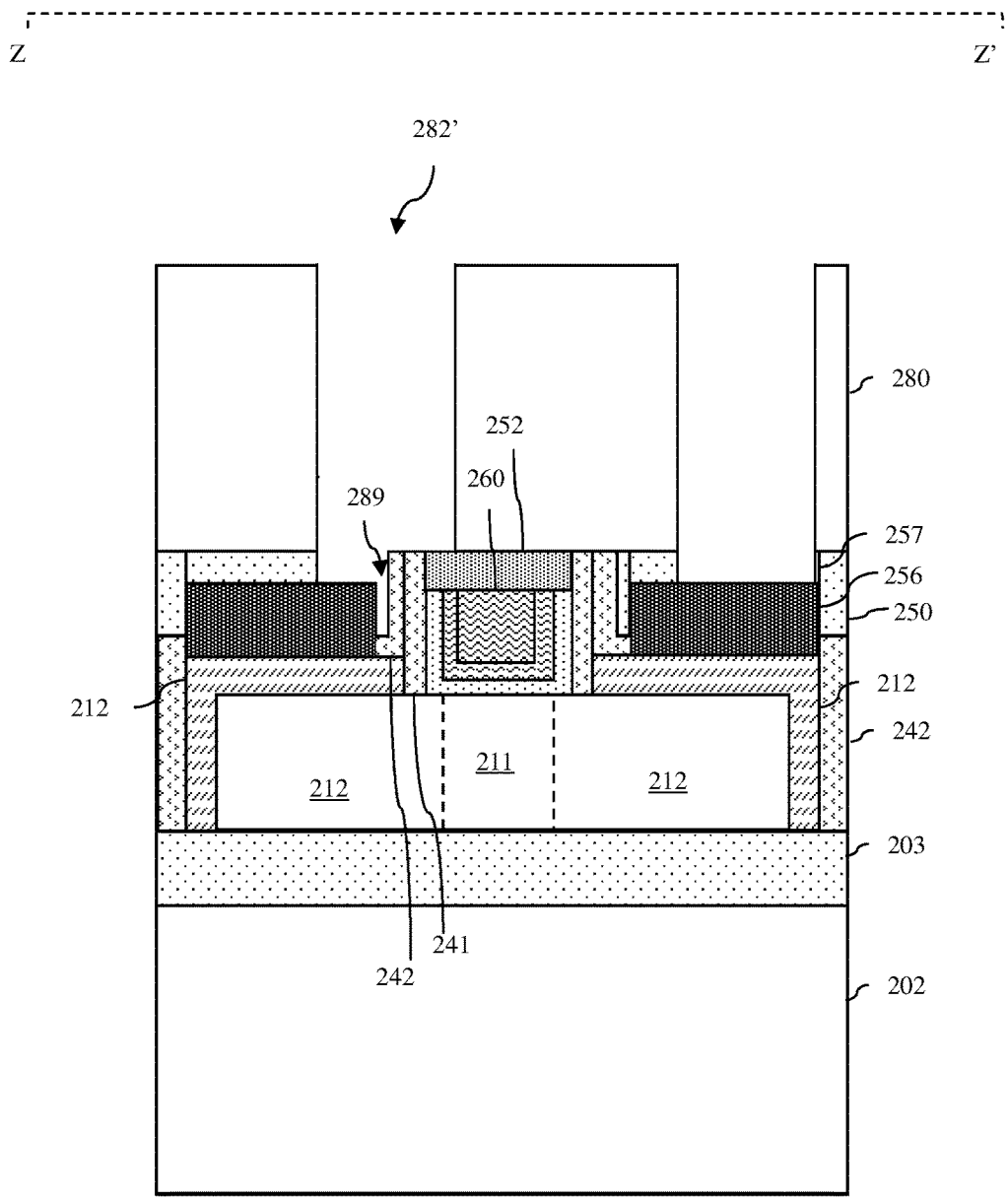
Figure 18:
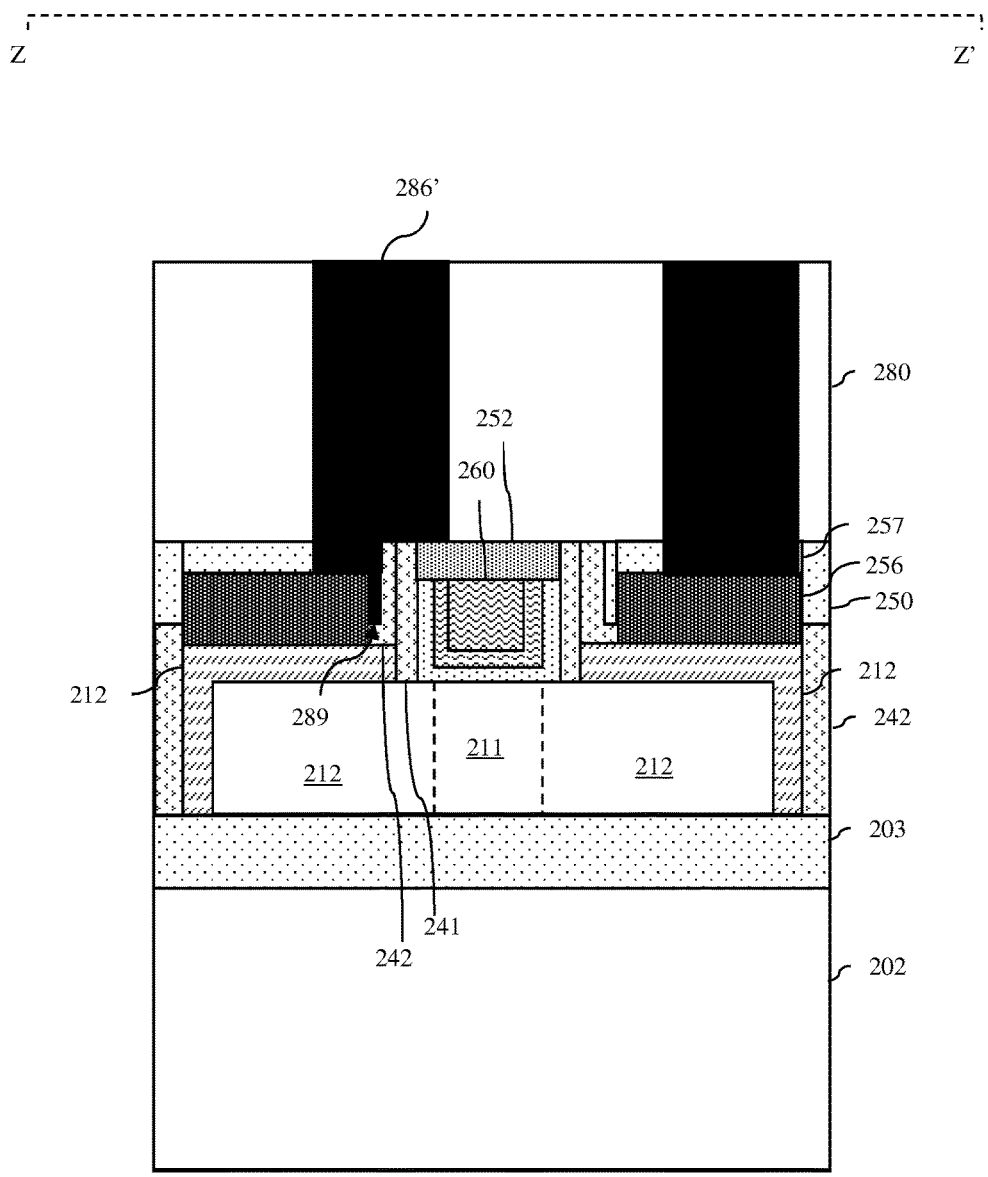
FIG. 18 is a cross section Z-Z' diagram illustrating a portion of a completed structure formed according to the methods of FIG. 1; and, FIG. 19A-19C are cross section X-X', cross section W-W' and cross section Z-Z' diagrams illustrating different portions of an integrated circuit (IC) structure that incorporates at least one field effect transistor (FET), where the FET has a gate and where a gate contact to the gate lands on a portion of the gate above (or close thereto) an active region.

Additionally, second contact openings 282 for the second contacts to the metal plugs 256 can be formed through the ILD material 280 and the additional dielectric caps 257 to the metal plugs 256 using a different etch process that is selective to the material of the additional dielectric caps 257 (e.g., silicon oxide) over the materials of the dielectric cap 252 (e.g., silicon nitride) and the dielectric sidewall spacer 241 and conformal dielectric layer 242 (114, see FIGS. 15A-15C). The second contact openings 282 can be filled with conductive material (e.g., tungsten, cobalt, copper, or any other suitable conductive material), thereby forming second contacts 286 (see FIG. 16). Since the additional dielectric caps 257 on the metal plugs 256 are selectively etchable over the dielectric sidewall spacer 241, the conformal dielectric layer 242 and the dielectric cap 252, the second contacts 286 will be self-aligned to the metal plugs 256 (i.e., will be self-aligned second contacts), regardless of any misalignment that occurs, and the risk of exposure of any of the replacement metal gate 260 that could result in shorting between a second contact 286 and the replacement metal gate 260 is avoided (or at least significantly reduced). For example, referring to the misaligned second contact openings 282' shown in FIGS. 17A-17B, when any of the second contact openings are offset from the metal plugs 256 (e.g., due to overlay control issues) so as to have a first portion that overlaps a metal plug 256 and a second portion that overlaps the replacement metal gate 260, etching of the second portion will stop on the dielectric cap 252, on the dielectric sidewall spacer 241 and on the vertical section of the conformal dielectric layer 242 and etching of the first portion will continue through the additional dielectric cap 257 stopping on the metal plug 256. Thus, the first portion of the misaligned second contact opening 282' will be deeper than the second portion and the method thereby protects against the development of a short between any misaligned second contact 286' and the replacement metal gate 260 upon filling of the misaligned second contact opening 282' with conductive material (as shown in FIG. 18).

As mentioned above, the metal plugs 256 are formed within metal plug openings 255 that extend vertically through the additional dielectric layer 250 to the raised first source/drain regions 213 and the raised second source/drain regions 223. Also, as mentioned above, the additional dielectric layer 250 and the additional dielectric caps 257 on the metal plugs 256 can be made of the same dielectric material (e.g., silicon oxide). Thus, at process 114 (FIG. 1), any portion of the additional dielectric layer 250 that is adjacent to a metal plug 256 and that is exposed during the forming of a misaligned second contact openings 282' will be etched away leaving a divot 289, as shown in FIG. 17B. Such a divot 289 at least partially exposes a sidewall of the metal plug 256. In this case, the divot 289 will be filled with the conductive material during the filling of the misaligned second contact openings 282', thereby increasing interface area between the misaligned second contact 286' and the metal plug 256, reducing contact resistance and improving performance.

While separate processes must be used to form (i.e., lithographically pattern and etch) the first contact opening for the first contact and the second contact openings for the second contacts, the same or different deposition processes can be used to fill these openings with conductive material. Thus, the same or different conductive materials can fill the first contact opening and the second contact openings. Additionally, a first single damascene process and a second single damascene process can be used to form the first contact and the second contacts, respectively, and, after these two single damascene processes are performed, the BEOL metal levels can be formed. Alternatively, one single damascene process can be used to form either the first contact or the second contacts and, after this single damascene process is performed, a dual damascene process can be used to form the remaining MOL contacts and the first metal level (referred to herein as M0) above the MOL contacts.

Also disclosed herein are integrated circuit (IC) structures that are formed according to the disclosed methods so as to incorporate at least one field effect transistor (FET), where the FET has a gate and where a gate contact to the gate lands on a portion of the gate above (or close thereto) an active region (i.e., where a gate contact is a CBoA). As mentioned above, the disclosed methods can be used to form IC structures that incorporate planar FET(s) or non-planar FET(s), that incorporate a conventional gate-first gate or a replacement metal gate, that incorporate a complementary metal oxide semiconductor (CMOS) device with both an N-type FET (NFET) and a P-type FET (PFET), that incorporate a CMOS device where the NFET and PFET each have multiple semiconductor bodies and have a shared gate, etc.

Figure 19A:
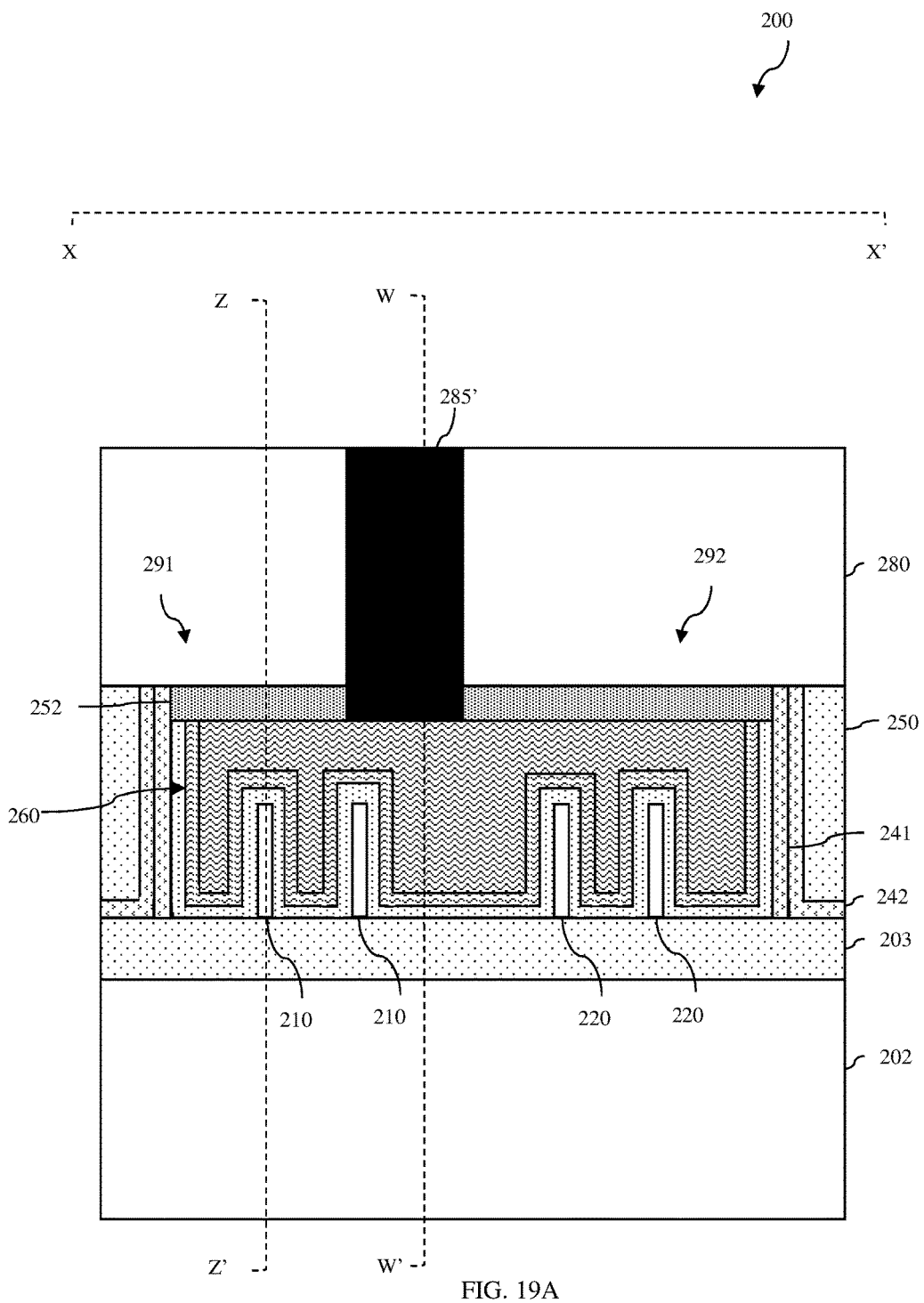
Figure 19B:
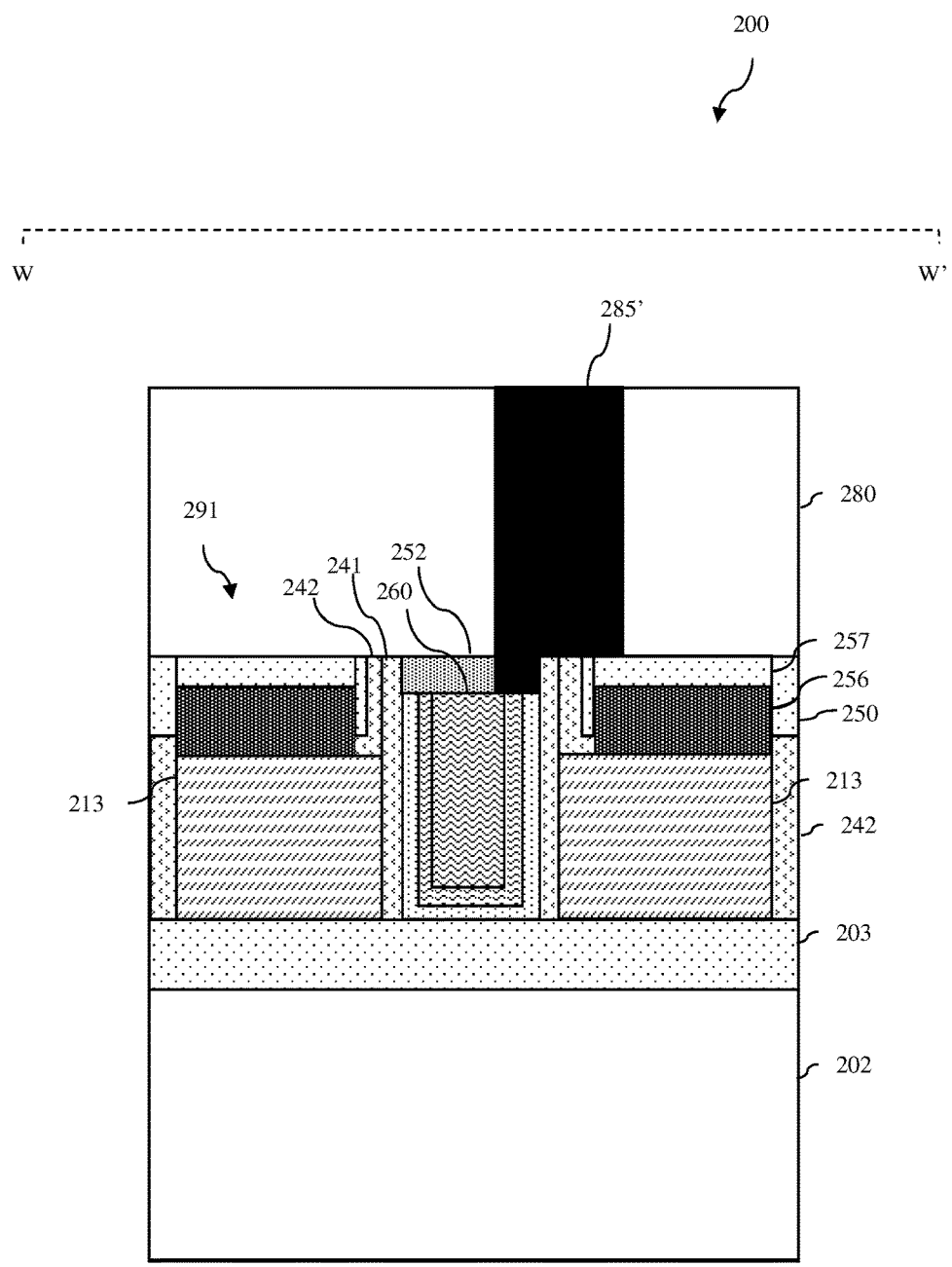
Figure 19C:
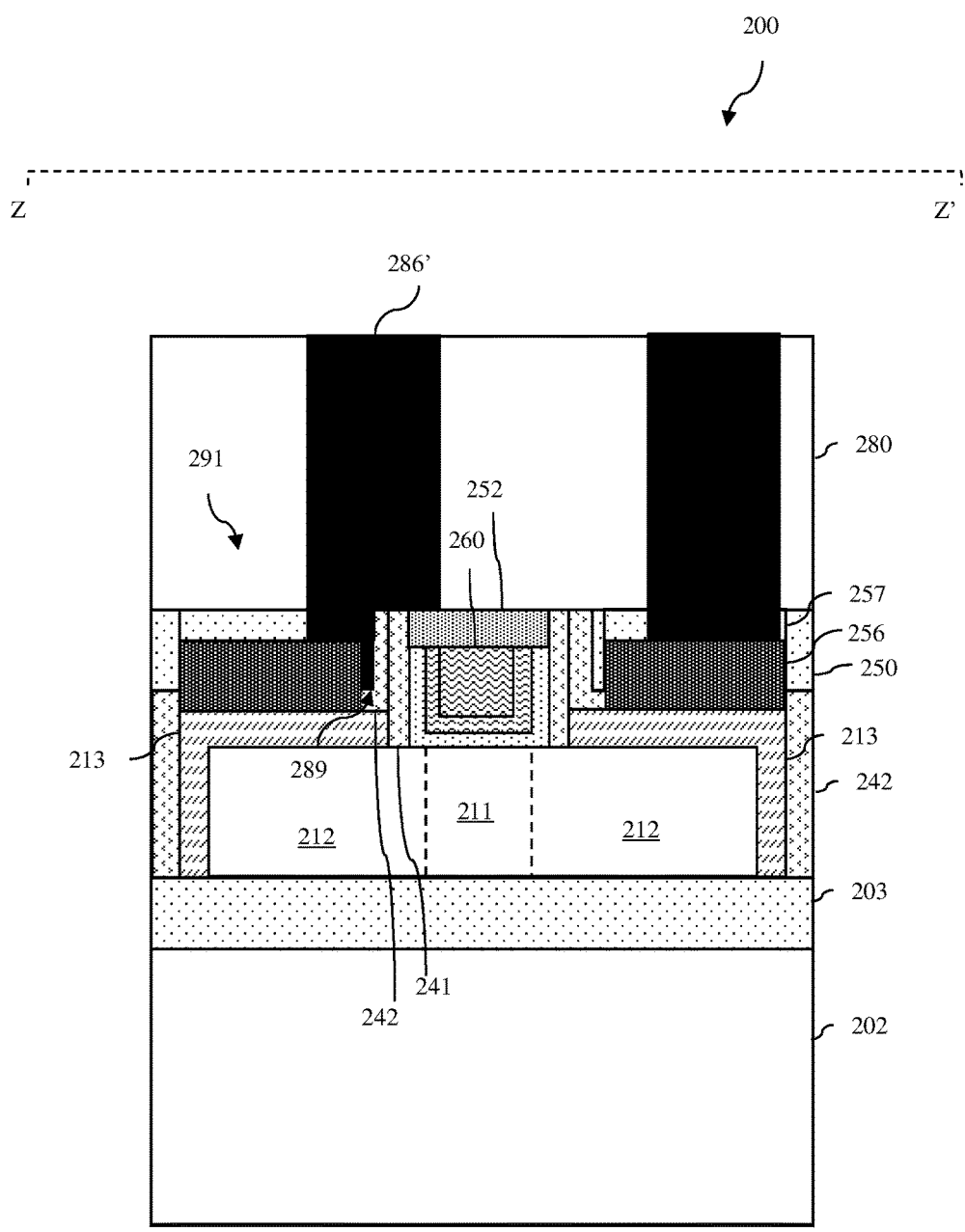

FIGS. 19A-19C illustrate one embodiment of such an integrated circuit (IC) structure 200 and, particularly, an embodiment of an IC structure 200 that incorporates a CMOS device with both a non-planar first-type FET 291 (e.g., an NFET) and a non-planar second-type FET 292 (e.g., a PFET), where the NFET 291 and PFET 292 share a gate 260 (e.g., a replacement metal gate) and where a gate contact 285' to the gate 260 lands, for example, on a portion of the gate 260 over an active region (i.e., where gate contact 285' is a CBoA).

This IC structure 200 is formed, for example, on a semiconductor-on-insulator (SOI) wafer that includes a semiconductor substrate 202 (e.g., a silicon substrate) and an insulator layer 203 (e.g., a buried oxide (BOX) layer or other suitable insulator layer on the semiconductor substrate) and a semiconductor layer (e.g., a silicon layer or other suitable semiconductor layer) on the insulator layer 203 (as shown). Alternatively, the IC structure 200 can be formed on a bulk semiconductor wafer (e.g., a bulk silicon wafer or other suitable bulk semiconductor wafer).

The first-type FET 291 (e.g., an NFET) includes at least one first semiconductor body 210. The second-type FET 292 (e.g., a PFET) includes at least one second semiconductor body 220. The first and second semiconductor bodies 210, 220 can be formed in the semiconductor layer of an SOI wafer (or, if applicable, in upper portion of a bulk semiconductor wafer separated from the lower portion by a buried well region). In any case, the first and second semiconductor bodies 210, 220 can, for example, be fin-shaped semiconductor bodies (i.e., relatively thin rectangular semiconductor bodies). Each first semiconductor body 210 can include first source/drain regions 212 and a first channel region 211 positioned laterally between the first source/drain regions 212. Each second semiconductor body 220 can include second source/drain regions 222 and a second channel region 221 positioned laterally between the second source/drain regions 222 (as discussed above and illustrated with regard to the method steps).

A gate 260 (e.g., a gate-first gate or a replacement metal gate, as discussed in detail above with regard to the methods) having a dielectric cap 252 and a dielectric sidewall spacer 241 can be adjacent to the semiconductor bodies 210, 220 at the respective channel regions 211, 221. In the case of a non-planar FETs with a shared gate, as illustrated, the gate 260 can be adjacent to the opposing sidewalls and top surface of each first semiconductor body 210 at the first channel region 211 and adjacent to the opposing sidewalls and top surface of each second semiconductor body 220 at the second channel region 221.

Optionally, epitaxial semiconductor material can be adjacent to the opposing sidewalls and top surface of each first semiconductor body 210 at the first source/drain regions 212, thereby creating a raised first source/drain region 213, and adjacent to the opposing sidewalls and top surface of each second semiconductor body 220 at the second source/drain regions 222, thereby forming a raised second source/drain region 223. Optionally, the epitaxial semiconductor material on adjacent first source/drain regions 212 can be merged into a single region and, similarly, the epitaxial semiconductor material on adjacent second source/drain regions 222 can be merged into a single region, as illustrated).

In the above described FETs 291, 292, the first channel region 211 for the first-type FET 291 (e.g., an NFET) in each first semiconductor body 210 can have, for example, a second-type conductivity at a relatively low conductivity level (e.g., a P− conductivity). The second channel region 221 for the second-type FET 292 (e.g., a PFET) in each second semiconductor body 220 can have, for example, a first-type conductivity at a relatively low conductivity level (e.g., an N− conductivity). Additionally, the first source/drain regions 212 (or, if applicable, the raised first source/drain regions 213) for the first-type FET 291 can, for example, be doped with a first dopant so as to have the first-type conductivity at a relatively high conductivity level (e.g., N+ conductivity). The second source/drain regions 222 (or, if applicable, the raised second source/drain regions 223) of the second-type FET 292 can, for example, be doped with a second dopant so as to have the second-type conductivity at a relatively high conductivity level (e.g., P+ conductivity).

The IC structure 200 can further have at least one dielectric layer, including a conformal dielectric layer 242 and an additional dielectric layer 250, stacked above the first source/drain regions 212 (or, raised first source/drain regions 213, as illustrated) and the second source/drain regions 222 (or, raised second source/drain regions 223) and further positioned laterally adjacent to the dielectric sidewall spacer 241. Metal plugs 256 with additional dielectric caps 257, respectively, can be within metal plug openings that extend vertically through the at least one dielectric layer (e.g., through the additional dielectric layer 250 and the conformal dielectric layer 242) to the first source/drain regions 212 (or, raised first source/drain regions 213, as illustrated) and to second source/drain regions 222 (or, raised second source/drain regions 223). Thus, the dielectric sidewall spacer 241 is positioned laterally between the metal plugs 256 and the gate 260 and further between the additional dielectric caps 257 and the dielectric cap 252.

The dielectric cap 252 on the gate 260, the dielectric sidewall spacer 241 on the gate 260, and the additional dielectric caps 257 on the metal plugs 256 should all be made of different dielectric materials. These different materials can be preselected so that, during subsequent processing (e.g., see process steps 110-114, discussed in greater detail above), the dielectric cap 252 is selectively etchable over the dielectric sidewall spacer 241 and the additional dielectric caps 257 and so that the additional dielectric caps 257 are selectively etchable over the dielectric sidewall spacer 241 and the dielectric cap 252. The additional dielectric layer 250 and additional dielectric caps 257 can be made of the same dielectric material. Exemplary dielectric materials can include, for example, silicon nitride for the dielectric cap 252, silicon carbon oxide for the dielectric sidewall spacer 241 and silicon oxide for the additional dielectric caps 257 and the additional dielectric layer 250. Alternatively, any other suitable dielectric materials could be used. In any case, the dielectric cap 252 on the gate 260, the dielectric sidewall spacer 241 on the gate 260, the additional dielectric caps 257 on the metal plugs 256 and the additional dielectric layer 250 can all have approximately co-planar top surfaces.

An interlayer dielectric material 280 can be on and, particularly, immediately adjacent to and can cover top surfaces of the dielectric cap 252, the dielectric sidewall spacer 241, the conformal dielectric layer 242, the additional dielectric layer 250 and the additional dielectric caps 257. The ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.). After the ILD material is deposited, another CMP process can be performed.

A first contact opening can extend vertically through the interlayer dielectric material 280 and the dielectric cap 252 to the gate 260. Additionally, second contact openings can extend vertically through the interlayer dielectric material 280 and the additional dielectric caps 257 to the metal plugs 256. The first contact opening and the second contact openings can be filled with conductive material to form a first contact to the gate 260 and second contacts to the metal plugs 256, respectively. Since the dielectric cap 252 on the gate 260 is selectively etchable over the dielectric sidewall spacer 241 and the additional dielectric caps 257 during formation of the first contact opening, the first contact will be self-aligned to the gate 260 (i.e., will be a self-aligned first contact), regardless of whether any misalignment occurs during processing, and the risk of a short occurring between the first contact and any of the metal plugs is avoided (or at least significantly reduced). Similarly, since the additional dielectric caps 257 are selectively etchable over the dielectric sidewall spacer 241 and the dielectric cap 252 during formation of the second contact openings, the second contacts will be self-aligned to the metal plugs 256 (i.e., will be self-aligned second contacts), regardless of whether any misalignment occurs during processing, and the risk of a short occurring between any of the second contacts 286 and the gate 260 is avoided (or at least significantly reduced).

For example, referring to FIG. 19B, when the first contact opening is offset from the gate 260 (e.g., due to overlay control issues) such that it has a first portion that overlaps the gate 260 and a second portion that overlaps a metal plug 256, etching of the second portion will stop on the additional dielectric cap 257 and etching of the first portion will continue stopping on the gate 260. Thus, the first portion of the misaligned first contact opening will be deeper than the second portion and protection is provided against the development of a short between the resulting misaligned first contact 285' and the metal plug 256 upon filling of the misaligned first contact opening with conductive material.

Similarly, as illustrated in FIG. 19C, when a second contact opening is offset from a metal plug 256 (e.g., due to overlay control issues) such that it has a first portion that overlaps a metal plug 256 and a second portion that overlaps the gate 260, etching of the second portion will stop on the dielectric cap 252 and dielectric sidewall spacer 241 and etching of the first portion will continue through the additional dielectric cap 257 stopping on the metal plug 256. Thus, the first portion of the misaligned second contact opening will be deeper than the second portion and protection is provided against the development of a short between any misaligned second contact 286' and the gate 260 upon filling of the misaligned second contact opening with conductive material.

As mentioned above, the metal plugs 256 are formed within metal plug openings that extend vertically through the additional dielectric layer 250 and the conformal dielectric layer 242 below. Also, as mentioned above, the additional dielectric layer 250 and the additional dielectric caps 257 on the metal plugs 256 can be made of the same dielectric material (e.g., silicon oxide). Thus, any portion of the additional dielectric layer 250 that is adjacent to a metal plug 256 and that is exposed when a second contact opening is misaligned will be etched away leaving a divot 289 (e.g., positioned laterally between the dielectric sidewall spacer 241 and the metal plug 256), as shown in FIG. 19C. Such a divot 289 at least partially exposes a sidewall of the metal plug 256 and is filled with conductive material. Thus, the interface area between a misaligned second contact 286' and a metal plug 256 will be increased, reducing contact resistance and improving performance.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are methods of forming an integrated circuit (IC) structure, which includes one or more field effect transistors (FETs). The disclosed methods allow for a gate contact to be formed on a portion of a gate aligned above an active region of a FET (i.e., a CBoA) or to be formed close thereto (e.g., to be formed on a portion of a gate in close proximity to the active region and/or in close proximity to any metal plugs). The disclosed methods also provide protection against the development of shorts between the gate contact and any metal plugs on the FET source/drain regions and further between the gate and source/drain contacts to the metal plugs. Specifically, in the methods, a gate with a dielectric cap and dielectric sidewall spacer can be formed on the channel region of a FET or, optionally, on the channel regions of multiple FETs. Additionally, metal plugs with additional dielectric caps can be formed on the source/drain regions of the FET or FET(s) such that the dielectric sidewall spacer is positioned laterally between the gate and the metal plugs and further between the dielectric cap on the gate and the additional dielectric caps on the metal plugs. The dielectric cap, dielectric sidewall spacer and additional dielectric caps can be made of different dielectric materials preselected to be selectively etchable, thereby allowing for possible misalignment of the contact opening to the gate without risking exposure of any metal plugs and vice versa. Also disclosed are resulting IC structures.

What is claimed is:

1. An integrated circuit structure comprising:
a semiconductor body for a field effect transistor, the semiconductor body comprising source/drain regions and a channel region positioned laterally between the source/drain regions;
a gate having a dielectric cap and a dielectric sidewall spacer, the gate being adjacent to the semiconductor body at the channel region;
a conformal dielectric layer having first portions above the semiconductor body at the source/drain regions, second portions positioned laterally adjacent to the dielectric sidewall spacer and third portions positioned laterally adjacent to the semiconductor body at the source/drain regions;
an additional dielectric layer above the first portions of the conformal dielectric layer and positioned laterally adjacent to the second portions of the conformal dielectric layer, wherein metal plug openings extend vertically through the additional dielectric layer and the first portions of the conformal dielectric layer to the source/drain regions;
metal plugs within the metal plug openings on the source/drain regions;
additional dielectric caps within the metal plug openings on the metal plugs, wherein the dielectric cap, the dielectric sidewall spacer and the additional dielectric caps comprise different dielectric materials, wherein the additional dielectric layer and the additional dielectric caps comprise a same dielectric material, and wherein the dielectric sidewall spacer and one of the second portions of the conformal dielectric layer is positioned laterally between each metal plug and the gate and further between each additional dielectric cap and the dielectric cap;
interlayer dielectric material above the dielectric cap, the dielectric sidewall spacer and the additional dielectric caps;
a first contact comprising conductive material in a first contact opening extending vertically through the interlayer dielectric material and the dielectric cap to the gate; and
second contacts comprising the conductive material in second contact openings extending through the interlayer dielectric material and the additional dielectric caps to the metal plugs.

2. The integrated circuit structure of claim 1, wherein the first contact opening lands on the gate adjacent to an active region of the field effect transistor.

3. The integrated circuit structure of claim 1, wherein the dielectric cap, the dielectric sidewall spacer and the additional dielectric caps have approximately co-planar top surfaces.

4. The integrated circuit structure of claim 1, wherein, due to the different dielectric materials, the dielectric cap is selectively etchable over the dielectric sidewall spacer and the additional dielectric caps during formation of the first contact opening to allow for misalignment of the first contact opening without shorting of the first contact to any of the metal plugs and wherein, due to the different dielectric materials, the additional dielectric caps is selectively etchable over the dielectric sidewall spacer and the dielectric cap during formation of the second contact openings to allow for misalignment of any of the second contact openings without shorting of any of the second contacts to the gate.

5. The integrated circuit structure of claim 1, wherein the different dielectric materials comprise silicon nitride for the dielectric cap, silicon carbon oxide for the dielectric sidewall spacer and silicon oxide for the additional dielectric caps.

6. The integrated circuit structure of claim 1, wherein the gate comprises a replacement metal gate.

7. The integrated circuit structure of claim 1, wherein the additional dielectric caps and the additional dielectric layer comprise silicon dioxide and wherein the additional dielectric layer further has a divot that is adjacent to a metal plug sidewall and that is filled with the conductive material.

8. An integrated circuit structure comprising:
a semiconductor body for a field effect transistor, the semiconductor body comprising source/drain regions and a channel region positioned laterally between the source/drain regions;
a gate having a dielectric cap and a dielectric sidewall spacer, the gate being adjacent to the semiconductor body at the channel region;
at least one dielectric layer above the semiconductor body at the source/drain regions and positioned laterally adjacent to the dielectric sidewall spacer, wherein the at least one dielectric layer has metal plug openings that extend vertically to the source/drain regions;
metal plugs having additional dielectric caps within the metal plug openings in the at least one dielectric layer and aligned above the source/drain regions, wherein the dielectric cap, the dielectric sidewall spacer and the additional dielectric caps comprise different dielectric materials, and wherein the dielectric sidewall spacer is positioned laterally between the metal plugs and the gate and further between the additional dielectric caps and the dielectric cap;
interlayer dielectric material above the dielectric cap, the dielectric sidewall spacer and the additional dielectric caps;
a first contact comprising conductive material in a first contact opening extending vertically through the interlayer dielectric material and the dielectric cap to the gate, wherein the first contact opening further extends laterally over the dielectric sidewall spacer and further over an additional dielectric cap such that the first contact is above and immediately adjacent to top surfaces of the dielectric sidewall spacer and the additional dielectric cap; and
second contacts comprising the conductive material in second contact openings extending through the interlayer dielectric material and the additional dielectric caps to the metal plugs, wherein the at least one dielectric layer further has a divot that is adjacent to a metal plug sidewall and that is filled with the conductive material.

9. The integrated circuit structure of claim 8, wherein the first contact opening lands on the gate adjacent to an active region of the field effect transistor.

10. The integrated circuit structure of claim 8, wherein the dielectric cap, the dielectric sidewall spacer and the additional dielectric caps have approximately co-planar top surfaces.

11. The integrated circuit structure of claim 8, wherein, due to the different dielectric materials, the dielectric cap is selectively etchable over the dielectric sidewall spacer and the additional dielectric caps during formation of the first contact opening to allow for misalignment of the first contact opening without shorting of the first contact to any of the metal plugs and wherein, due to the different dielectric materials, the additional dielectric caps is selectively etchable over the dielectric sidewall spacer and the dielectric cap during formation of the second contact openings to allow for misalignment of any of the second contact openings without shorting of any of the second contacts to the gate.

12. The integrated circuit structure of claim 8, wherein the different dielectric materials comprise silicon nitride for the dielectric cap, silicon carbon oxide for the dielectric sidewall spacer and silicon oxide for the additional dielectric caps.

13. The integrated circuit structure of claim 8, wherein the gate comprises a replacement metal gate.

14. An integrated circuit structure comprising:
- a semiconductor body for a field effect transistor, the semiconductor body comprising source/drain regions and a channel region positioned laterally between the source/drain regions;
- a gate having a dielectric cap and a dielectric sidewall spacer, the gate being adjacent to the semiconductor body at the channel region;
- at least one dielectric layer above the semiconductor body at the source/drain regions and positioned laterally adjacent to the dielectric sidewall spacer, wherein the at least one dielectric layer has metal plug openings that extend vertically to the source/drain regions;
- metal plugs having additional dielectric caps within the metal plug openings in the at least one dielectric layer and aligned above the source/drain regions, wherein the dielectric cap, the dielectric sidewall spacer and the additional dielectric caps comprise different dielectric materials, and wherein the dielectric sidewall spacer is positioned laterally between the metal plugs and the gate and further between the additional dielectric caps and the dielectric cap;
- interlayer dielectric material above the dielectric cap, the dielectric sidewall spacer and the additional dielectric caps;
- a first contact comprising conductive material in a first contact opening extending vertically through the interlayer dielectric material and the dielectric cap to the gate, wherein the first contact opening further extends laterally over the dielectric sidewall spacer and further over an additional dielectric cap such that the first contact is above and immediately adjacent to top surfaces of the dielectric sidewall spacer and the additional dielectric cap; and
- second contacts comprising the conductive material in second contact openings extending through the interlayer dielectric material and the additional dielectric caps to the metal plugs, wherein at least one of the second contact openings extends laterally over the dielectric sidewall spacer and the dielectric cap such that at least one of the second contacts is above and immediately adjacent to top surfaces of the dielectric sidewall spacer and the dielectric cap wherein the at least one dielectric layer further has a divot that is adjacent to a metal plug sidewall and that is filled with the conductive material.

15. The integrated circuit structure of claim 14, wherein the first contact opening lands on the gate adjacent to an active region of the field effect transistor.

16. The integrated circuit structure of claim 14, wherein the dielectric cap, the dielectric sidewall spacer and the additional dielectric caps have approximately co-planar top surfaces.

17. The integrated circuit structure of claim 14, wherein, due to the different dielectric materials, the dielectric cap is selectively etchable over the dielectric sidewall spacer and the additional dielectric caps during formation of the first contact opening to allow for misalignment of the first contact opening without shorting of the first contact to any of the metal plugs and wherein, due to the different dielectric materials, the additional dielectric caps is selectively etchable over the dielectric sidewall spacer and the dielectric cap during formation of the second contact openings to allow for misalignment of any of the second contact openings without shorting of any of the second contacts to the gate.

18. The integrated circuit structure of claim 14, wherein the different dielectric materials comprise silicon nitride for the dielectric cap, silicon carbon oxide for the dielectric sidewall spacer and silicon oxide for the additional dielectric caps.

* * * * *